United States Patent
Kang et al.

(10) Patent No.: US 8,125,844 B2
(45) Date of Patent: *Feb. 28, 2012

(54) SEMICONDUCTOR MEMORY DEVICE FOR LOW VOLTAGE

(75) Inventors: Hee-Bok Kang, Kyoungki-do (KR); Jin-Hong Ahn, Kyoungki-do (KR); Sang-Don Lee, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 28 days.

This patent is subject to a terminal disclaimer.

(21) Appl. No.: 12/578,358

(22) Filed: Oct. 13, 2009

(65) Prior Publication Data

US 2010/0027362 A1    Feb. 4, 2010

Related U.S. Application Data

(62) Division of application No. 11/340,868, filed on Jan. 27, 2006, now abandoned.

(30) Foreign Application Priority Data

Jan. 28, 2005   (KR) .............................. 2005-0008131

(51) Int. Cl.
*G11C 7/00*    (2006.01)

(52) U.S. Cl. .................... 365/203; 365/63; 365/189.08; 365/189.09; 365/207; 365/210.1

(58) Field of Classification Search ................ 365/203, 365/63, 189.08, 189.09, 207, 210.1, 190
See application file for complete search history.

(56) References Cited

U.S. PATENT DOCUMENTS

| | | | | |
|---|---|---|---|---|
| 5,675,530 | A * | 10/1997 | Hirano et al. | 365/145 |
| 5,748,536 | A * | 5/1998 | Kwon et al. | 365/185.25 |
| 5,969,979 | A * | 10/1999 | Hirano | 365/145 |
| 5,978,250 | A * | 11/1999 | Chung et al. | 365/145 |
| 6,510,093 | B1 * | 1/2003 | Dhong et al. | 365/210.1 |
| 6,525,956 | B2 * | 2/2003 | Murakuki | 365/145 |
| 7,046,565 | B1 * | 5/2006 | Barth et al. | 365/203 |
| 7,126,867 | B2 * | 10/2006 | Kang et al. | 365/203 |
| 7,251,174 | B2 * | 7/2007 | Kang et al. | 365/203 |
| 7,295,482 | B2 * | 11/2007 | Kang et al. | 365/203 |
| 7,359,268 | B2 * | 4/2008 | Kang et al. | 365/208 |
| 7,414,896 | B2 * | 8/2008 | Oh | 365/189.011 |

* cited by examiner

*Primary Examiner* — Viet Q Nguyen
(74) *Attorney, Agent, or Firm* — IP & T Group LLP

(57) ABSTRACT

A semiconductor memory device includes a first cell array including a plurality of unit cells and a bit line sense amplifying unit for sensing and amplifying data signals stored in the unit cells. Each unit cell is provided with a PMOS transistor and a capacitor. Therefore, the semiconductor memory device efficiently operates with low voltage without any degradation of operation speed.

52 Claims, 14 Drawing Sheets

FIG. 13
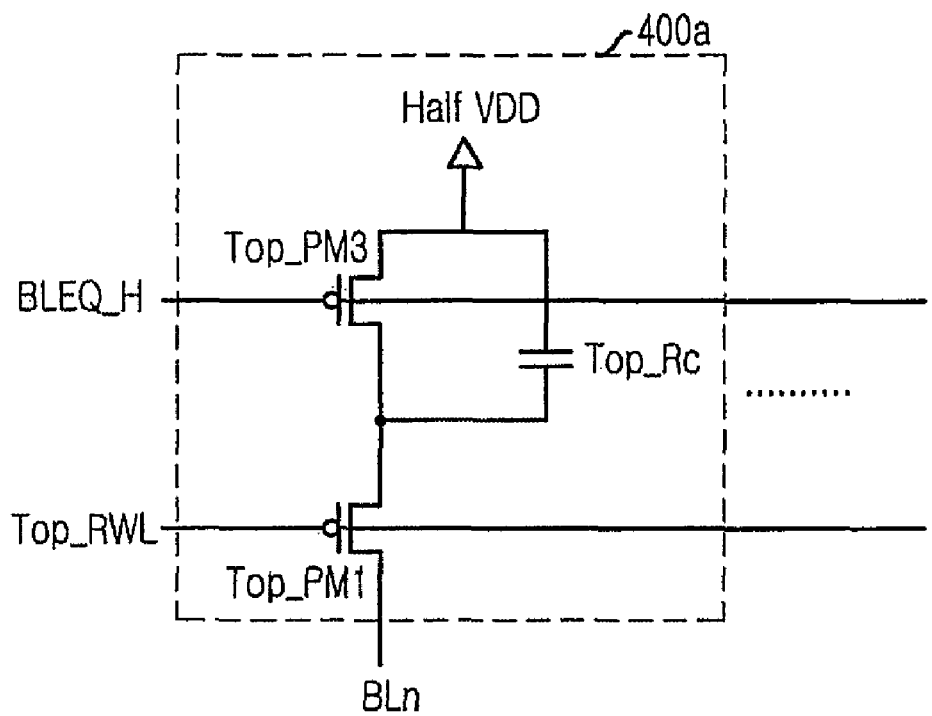
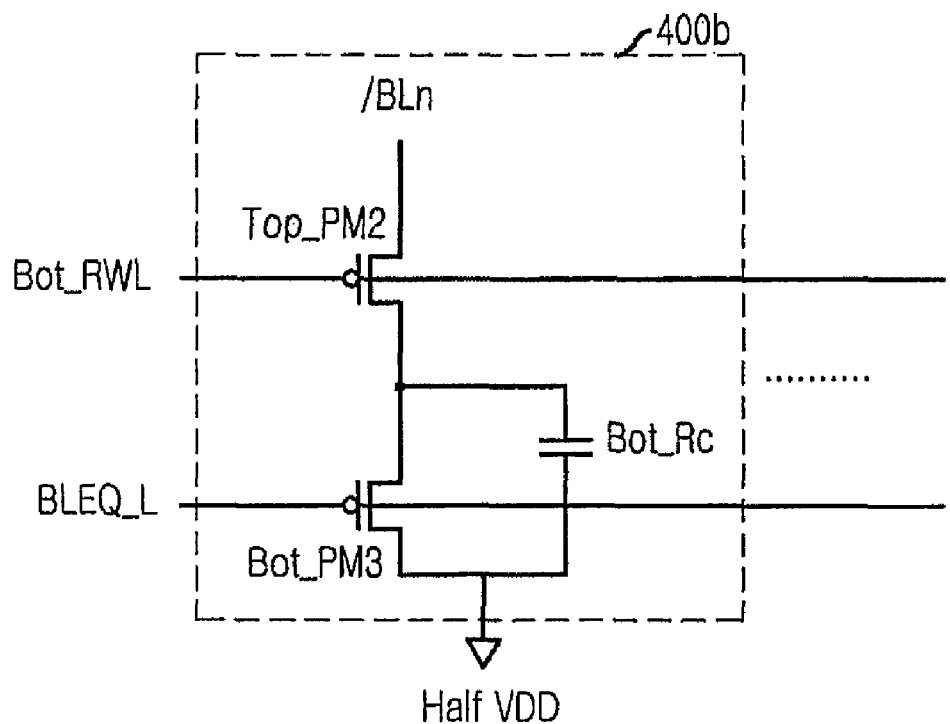

SEMICONDUCTOR MEMORY DEVICE FOR LOW VOLTAGE

CROSS-REFERENCE TO RELATED APPLICATIONS

This application is a division of U.S. patent application Ser. No. 11/340,868 filed on Jan. 27, 2006, now abandoned which claims priority of Korean patent application number 10-2005-0008131, filed in the Korean Patent Office on Jan. 28, 2005, the disclosure of each of which applications is incorporated by reference in its entirety.

FIELD OF THE INVENTION

The present invention relates to a semiconductor memory device; and, more particularly, to a semiconductor memory device for efficiently operating under a low power supply voltage condition.

DESCRIPTION OF RELATED ARTS

FIG. 1 is a block diagram describing a conventional semiconductor memory device.

As shown, the conventional semiconductor memory device includes a row address decoder 20, a column address decoder 30, a cell area 100 and a data input/output block 40.

The cell area 100 includes a plurality of cell arrays, e.g., 110, 120, 130 and 140 and a plurality of sense amplifying blocks, e.g., 150 and 160. The row address decoder 20 receiving a row address decodes the row address in order to access a data stored in the cell area 100. The column address decoder 30 receiving a column address decodes the column address in order to access the data stored in the cell area 100. The data input/output block 40 is for outputting a data stored in the cell area 100 or transmitting data inputted through a data pad/pin into the cell area 100.

That is, during a read operation, the data accessed in response to the row address and the column address is outputted to the data input/output block 40. On the contrary, under a write operation, a data inputted from an external circuit is stored in a unit cell corresponding to the row address and the column address through the data input/output block 40.

In detail, each cell array, e.g., 110, included in the cell area 100 includes a plurality of unit cells, each for storing a data. Each sense amplifying block, e.g., 150, is for sensing and amplifying data outputted from each cell array, e.g., 110.

FIG. 2 is a block diagram depicting a detailed structure of the cell array 110 shown in FIG. 1.

As shown, a first cell array 110 includes a plurality of bit line pairs, e.g., BL and /BL, a plurality of cells, e.g., CELL1, CELL2 and CELL3, and a plurality of word lines, e.g., WL0 to WL5. Herein, each cell is constituted with one capacitor (C0, C1, C2, C3, C4 or C5) and one transistor (M0, M1, M2, M3, M4 or M5). For instance, a first cell CELL1 includes a first capacitor C0 coupled to a plate line PL and a first MOS transistor M0 having a gate coupled to a first word line WL0. The first MOS transistor M0 is coupled between the first capacitor C0 and a bit line BL for connecting or disconnecting the first capacitor C0 to a bit line BL in response to a word line WL0.

Also, the first cell CELL1 and a second cell CELL2 respectively coupled to the first word line WL0 and a second word line WL1 and neighbored with each other are commonly connected to the bit line BL. The bit line pair BL and /BL is coupled to a sense amplifier 152a included in the sense amplifying block 150.

FIG. 3 is a block diagram describing a connection between each cell array and each sense amplifying block included in the cell area 100 shown in FIG. 1.

Particularly, the conventional semiconductor memory device has a shared bit line sense amplifier structure. Herein, the shared bit line sense amplifier structure means that two neighbor cell arrays are coupled to one sense amplifying block.

As shown, there are a plurality of cell arrays 110, 130 and 180 and a plurality of sense amplifying blocks 150 and 170. The first sense amplifying block 150 is coupled to the first cell array 110 and the second cell array 130; and the second sense amplifying block 170 is coupled to the second cell array 130 and the fifth cell array 180.

If one cell array is coupled to one sense amplifying block, the sense amplifying block includes a plurality of sense amplifiers SA each corresponding to each bit line pair included in the cell array. That is, the number of the sense amplifiers included in the sense amplifying block is same to the number of bit lines included in the cell array. However, referring to FIG. 3, since two cell arrays share one sense amplifying block in common under the shared bit line sense amplifier structure, the sense amplifying block has a number of sense amplifiers each corresponding to each two bit line pairs. That is, the number of the sense amplifiers included in the sense amplifying block can be decreased by half.

Under the shared bit line sense amplifier structure for implementing a higher integrated circuit, the sense amplifying block, e.g., 150, further includes a first connection block 151 and a second connection block 153. Since the first sense amplifying block 150 is commonly coupled to two neighbor cell arrays 110 and 130, there should be control for connecting or disconnecting the first sense amplifying block 150 to one of the two neighbor cell arrays 110 and 130. Each of the first and the second connection blocks 151 and 153 has a plurality of switching units, e.g., transistors. The plurality of transistors, e.g., MN1 to MN4, in the first connection block 151 is turned on or off based on a first connection control signal BISH1; and the plurality of transistors, e.g., MN5 to MN8, in the second connection block 153 is turned on or off based on a second connection control signal BISL1.

For instance, if the first connection control signal BISH1 is activated, all transistors included in the first connection block 151 is turned on, that is, the first cell array 110 is coupled to the sense amplifier block 152 of the first sense amplifying block 150. Otherwise, if the second connection control signal BISL1 is activated, all transistors included in the second connection block 153 is turned on, that is, the second cell array 130 is coupled to the sense amplifier block 152 of the first sense amplifying block 150.

Likewise, another sense amplifying block 170 includes a plurality of sense amplifiers and two connection blocks controlled in response to other connection control signals BISH2 and BISL2 for connecting or disconnecting a sense amplifier block of the sense amplifying block 170 to one of the two neighbor cell arrays 130 and 180.

Moreover, each sense amplifying block, e.g., 150, further includes a precharge block and a data output block except for connection blocks and sense amplifiers.

FIG. 4 is a block diagram showing the sense amplifying block 150 shown in FIG. 2.

As shown, the sense amplifying block 150 includes a sense amplifier 152a, a precharge block 155a, first and second equalization blocks 154a and 157a and a data output block 156a.

The sense amplifier 152a receives power supply signals SAP and SAN for amplifying a potential difference between the bit line pair BL and /BL. Enabled by a precharge signal BLEQ when the sense amplifier 152a is not activated, the precharge block 155a precharges the bit line pair BL and /BL as a bit line precharge voltage VBLP. In response to the precharge signal BLEQ, the first equalization block 154a makes a voltage level of the bit line BL same with a voltage level of the bit line bar /BL. Similar to the first equalization block 154a, the second equalization block 157a is also used for making a voltage level of the bit line BL be same to a voltage level of the bit line bar /BL. Lastly, the data output block 156a outputs a data amplified by the sense amplifier 152a to the local data bus pair LDB and LDBB based on a column control signal YI generated from a column address.

Herein, the sense amplifying block 150 further includes two connection blocks 151a and 153a each for connecting or disconnecting the sense amplifier 152a to one of neighbor cell arrays respectively based on connection control signals BISH and BISL.

FIG. 5 is a waveform showing an operation of the conventional semiconductor memory device.

Hereinafter, referring to FIGS. 1 to 5, the operation of the conventional semiconductor memory device is described in detail.

As shown, the read operation of the conventional semiconductor memory device can be split into four steps: a precharge step, a read step, a sense step and a restore step. Likewise, the write operation is very similar to the read operation. However, the write operation includes a write step instead of the read step in the read operation. That is, a sensed and amplified data is not outputted, instead, an inputted data from an external circuit is latched in the sense amplifier during the sense step.

Hereinafter, it is assumed that a capacitor of a cell is charged, i.e., stores a logic high data "1". Herein, a symbol 'SN' means a potential level charged in the capacitor of the cell. Also, one of two connection blocks in the sense amplifying block is activated and the other is inactivated. As a result, the sense amplifying block is coupled to one of two neighbor cell arrays.

In the precharge step, the bit line pair BL and /BL is precharged by the bit line precharge voltage VBLP. At this time, all word lines are inactivated. Generally, the bit line precharge voltage VBLP is a ½ core voltage, i.e., ½ Vcore=VBLP.

When the precharge signal BLEQ is activated as a logic high level, the first and second equalization blocks 154a and 157a and a precharge block 155a are also enabled. Thus, the bit line pair BL and /BL is percharged as the ½ core voltage. Herein, the first and second connection block 151a and 153a are also activated, i.e., all transistors included in the first and second connection block 151a and 153a are turned on.

In the read step, a read command is inputted and carried out. Herein, if the first connection block 151a is coupled to the first cell array 110 and the second connection block 153a is coupled to the second cell array 130, the sense amplifier 152a is coupled to the first cell array 110 when the first connection block 151a is activated and the second connection block 153a is inactivated. Otherwise, when the second connection block 153a is activated and the first connection block 151a is inactivated, the sense amplifier 152a is coupled to the second cell array 130 and disconnected to the first cell array 110.

In addition, a word line corresponding to an inputted address is activated by a power supply voltage VDD or a high voltage VPP until the restore step.

Herein, for activating the word line, the high voltage VPP is generally used because it is requested that the power supply voltage VDD becomes lower and an operating speed of the semiconductor memory device becomes faster.

If the word line is activated, a MOS transistor of the cell corresponding to the word line is turned on; and a data stored in a capacitor of the cell is delivered into the bit line BL.

Thus, the bit line BL precharged by the ½ core voltage is boosted up by a predetermined voltage level $\Delta V$. Herein, though the capacitor is charged as the core voltage Vcore, a voltage level of the bit line BL cannot be increased to the core voltage Vcore because a capacitance Cc of the capacitor is smaller than a parasitic capacitance Cb of the bit line BL.

Referring to FIG. 5, in the read step, it is understood that a voltage level of the bit line BL is increased by the predetermined voltage level $\Delta V$ and the symbol 'SN' is also decreased to that voltage level, i.e., Vcore/2+$\Delta V$.

At this time, i.e., when the data is delivered into the bit line BL, no data is delivered into the bit line bar /BL and, then, the bit line bar /BL keeps a ½ core voltage level.

Next, in the sense step, the first power supply signal SAP is supplied with the core voltage Vcore and the second power supply signal SAN is supplied with a ground GND. Then, the sense amplifier can amplify a voltage difference, i.e., a potential difference, between the bit line pair BL and /BL by using the first and the second power supply signals SAP and SAN. At this time, a relatively high side between the bit line pair BL and /BL is amplified to the core voltage Vcore; and the other side, i.e., a relatively low side between the bit line pair BL and /BL, is amplified to the ground GND.

Herein, a voltage level of the bit line BL is higher than that of the bit line bar /BL. That is, after the bit line BL and the bit line bar /BL are amplified, the bit line BL is supplied with the core voltage Vcore and the bit line bar /BL is supplied with the ground GND.

Lastly, in the restore step, the data outputted from the capacitor during the read step for boosting up the bit line BL by the predetermined voltage level $\Delta V$ is restored in the original capacitor. That is, the capacitor is re-charged. After the restore step, the word line corresponding to the capacitor is inactivated.

Then, the conventional semiconductor memory device carries out the precharge step again. Namely, the first and the second power supply signals SAP and SAN are respectively supplied with ½ core voltage Vcore. Also, the precharge signal BLEQ is activated and inputted to the first and the second equalization blocks 154a and 157a and the precharge block 155a. At this time, the sense amplifier 152a is coupled to the two neighbor cell arrays, e.g., 110 and 130, by the first and the second connection blocks 151a and 153a.

As a design technology for a semiconductor memory device is rapidly developed, a voltage level of a power supply voltage for operating the semiconductor memory device becomes lower. However, though the voltage level of the power supply voltage becomes lower, it is requested that an operation speed of the semiconductor memory device becomes faster.

For achieving the request about the operation speed of the semiconductor memory device, the semiconductor memory device includes an internal voltage generator for generating a core voltage Vcore having a lower voltage level than the power supply voltage VDD and a high voltage VPP having a higher voltage level than the core voltage Vcore.

Until now, a requested operation speed can be achieved by implementing a nano-scale technology for manufacturing the semiconductor memory device through using above described manner for overcoming a decrease of the voltage level of the power supply voltage VDD without any other particular method.

For example, through a voltage level of the power supply voltage is decreased from about 3.3 V to about 2.5 V or under 2.5 V, the requested operation speed is achieved if the nano-scale technology is implemented based on from about 500 nm to about 100 nm. This means that the semiconductor memory device is more integrated. That is, as the nano-scale technology is upgraded, i.e., developed, a power consumption of a fabricated transistor included in the semiconductor memory device is reduced and, if the voltage level of the power supply voltage is not decreased, an operation speed of the fabricated transistor becomes faster.

However, on the nano-technology based on under 100 nm, it is very difficult to develop the nano-technology. That is, there is a limitation for integrating the semiconductor memory device more and more.

Also, a requested voltage level of the power supply voltage becomes lower, e.g., from about 2.0 V to about 1.5 V or so far as about 1.0 V. Thus, the request about the power supply voltage cannot be achieved by only developing the nano-technology.

If a voltage level of the power supply voltage inputted to the semiconductor memory device is lower than a predetermined voltage level, an operating margin of each transistor included in the semiconductor memory device is not sufficient; and, as a result, a requested operation speed is not satisfied and an operation reliability of the semiconductor memory device is not guaranteed.

Also, the sense amplifier needs more time for stably amplifying a voltage difference between the bit line BL and the bit line bar /BL because a predetermined turned-on voltage, i.e., a threshold voltage, of the transistor is remained under a low power supply voltage.

Moreover, if a noise is generated at the bit line pair BL and /BL, each voltage level of the bit line BL and the bit line bar /BL is fluctuated, i.e., increased or decreased by a predetermined level on the ½ core voltage Vcore. That is, as the voltage level of the power supply voltage becomes lower, a little noise can seriously affect the operation reliability of the semiconductor memory device.

Therefore, there is a limitation for decreasing a voltage level of the power supply voltage under a predetermined level.

In addition, as the semiconductor memory device is more integrated, a size of the transistor becomes smaller and a distance between a gate of the transistor and the bit line gets near more and more. As a result, a bleed current is generated. Herein, the bleed current means a kind of leakage current between the gate of the transistor and the bit line because of a physical distance between the gate of the transistor and the bit line under a predetermined value.

FIG. 6 is a cross-sectional view describing a unit cell of the semiconductor memory device in order to show a cause of the bleed current.

As shown, the unit cell includes a substrate 10, an device isolation layer 11, source and drain regions 12a and 12b, a gate electrode 13, a bit line 17, a capacitor 14 to 16 and insulation layers 18 and 19. Herein, the symbol 'A' means a distance between the gate electrode 13 of the transistor and the bit line 17.

As it is rapidly developed the nano-technology for manufacturing the semiconductor memory device, the distance A between the gate electrode 13 of the transistor and the bit line 17 becomes shorter.

In the precharge step, the bit line BL is supplied with the ½ core voltage and the gate electrode 13, i.e., a word line, is supplied with the ground.

If the bit line 17 and the gate electrode 13 in a unit cell are electronically short since an error is occurred under a manufacturing process, a current flows continuously during the precharge step and a power consumption is increased. In this case, the semiconductor memory device includes a plurality of additional unit cells for substituting the unit cell where the bit line and the gate electrode are short-circuited. At this time, error cells are substituted with additional cells in word line basis.

Otherwise, if there is no error under the manufacturing process, i.e., the bit line 17 and the gate electrode 13 in a unit cell are not electronically short-circuited in any cell of the semiconductor memory device, there is no bleed current. However, if the distance between the gate electrode 13 of the transistor and the bit line 17, i.e., 'A', is too short without any error under the manufacturing process, the bleed current is generated and flown.

Recently, how to operate a semiconductor memory device under a low power condition is very important. If above described bleed current is generated, it is not appreciate that the semiconductor memory device having the bleed current is applied to a system though the semiconductor memory device can be normally operated.

For reducing an amount of the bleed current, it is suggested that a resistor is added between the gate electrode of the transistor and the bit line. However, although the resistor can reduce little amount of the bleed current, this is not effective and essential for reducing and protecting a flow of the bleed current.

SUMMARY OF THE INVENTION

It is, therefore, an object of the present invention to provide a semiconductor memory device for efficiently operating with low voltage without any degradation of operation speed.

In accordance with an aspect of the present invention, there is provided a semiconductor memory device including a first cell array including a plurality of unit cells, each provided with a PMOS transistor and a capacitor, and a bit line sense amplifier for sensing and amplifying information stored in the unit cells.

In accordance with another aspect of the present invention, there is provided a semiconductor memory device including a first and a second cell array, a bit line sense amplifier, a first and a second reference cell block, and a first and a second precharge block.

The first cell array includes a plurality of unit cell, each provided with a PMOS transistor and a capacitor, and a plurality of bit line pairs. The first cell array transmits a data signal stored in a unit cell selected from the unit cells to one of a first bit line pair, wherein the first bit line pair is selected from the bit line pairs. The bit line sense amplifier senses and amplifies a difference between the first bit line pair after the data signal is loaded at one of the first bit line pair. The first reference cell block for transmits a reference signal to a first bit line bar when the data signal is loaded at the first bit line and for transmits the reference signal to the first bit line when the data signal is loaded at the first bit line bar. The first precharge block equalizes the first bit line pair without supplying any precharge voltage at a precharge sector.

Further, the second cell array includes a plurality of unit cells, each provided with a PMOS transistor and a capacitor, and a plurality of bit line pairs. The second cell array transmits a data signal stored in a unit cell selected from the unit cells to one of a second bit line pair, wherein the second bit line pair is selected from the bit line pairs. The second reference cell block transmits a reference signal to a second bit line bar when the data signal is loaded at the second bit line and transmits the reference signal to the second bit line when the data signal is loaded at the second bit line bar. The second precharge block equalizes the second bit line pair without supplying any precharge voltage at a precharge sector.

In accordance with still another aspect of the present invention, there is provided a method for driving a semiconductor memory device including a plurality of unit cells and a plurality of bit line pairs. The method includes turning on a PMOS transistor included in a unit cell selected from the unit cells; transmitting a data signal stored in the unit cell to a corresponding bit line; and sensing and amplifying a difference between the bit line and a bit line bar corresponding to the bit line based on a low voltage which is lower than a ground voltage.

In accordance with still another aspect of the present invention, there is provided a method for driving a semiconductor memory device having a folded bit line structure and including a plurality of unit cells, each provided with a PMOS transistor and a capacitor, and a plurality of bit line pairs. The method includes connecting a first bit line pair to a bit line sense amplifier and disconnecting a second bit line pair from the bit line sense amplifier; activating a PMOS transistor of a unit cell selected from the plurality of unit cells configured in the first cell array to thereby transmitting a data stored in the unit cell to a first bit line; transmitting a reference signal to a first bit line bar; and sensing and amplifying a difference between a first bit line pair provided with the first bit line and the first bit line bar based on a ground voltage and a low voltage.

In accordance with still another aspect of the present invention, there is provided a semiconductor memory device. The semiconductor memory device includes a first cell array including a plurality of unit cells, each provided with a PMOS transistor and a capacitor, for transmitting a first data signal stored in a unit cell selected from the unit cells to a first bit line corresponding to the first data signal; a second cell array including a plurality of unit cells, each provided with a PMOS transistor and a capacitor, for transmitting a second data signal stored in a unit cell selected from the unit cells to a second bit line corresponding to the second data signal; a bit line sense amplifier for sensing and amplifying a difference between the first bit line the second bit line; a reference cell block transmitting a reference signal to the second bit line when the data signal is loaded at the first bit line and for transmitting the reference signal to the first bit line when the data signal is loaded at the second bit line; and a precharge block for equalizing the first bit line and the second bit line without supplying the first and the second bit lines with any precharge voltage at a precharge sector.

BRIEF DESCRIPTION OF THE DRAWINGS

The above and other objects and features of the present invention will become apparent from the following description of preferred embodiments taken in conjunction with the accompanying drawings, in which:

FIG. 13 is a schematic circuit diagrams depicting a reference cell block shown in FIG. 12.

DETAILED DESCRIPTION OF THE INVENTION

Hereinafter, a semiconductor memory device in accordance with the present invention will be described in detail referring to the accompanying drawings.

Figure 1:
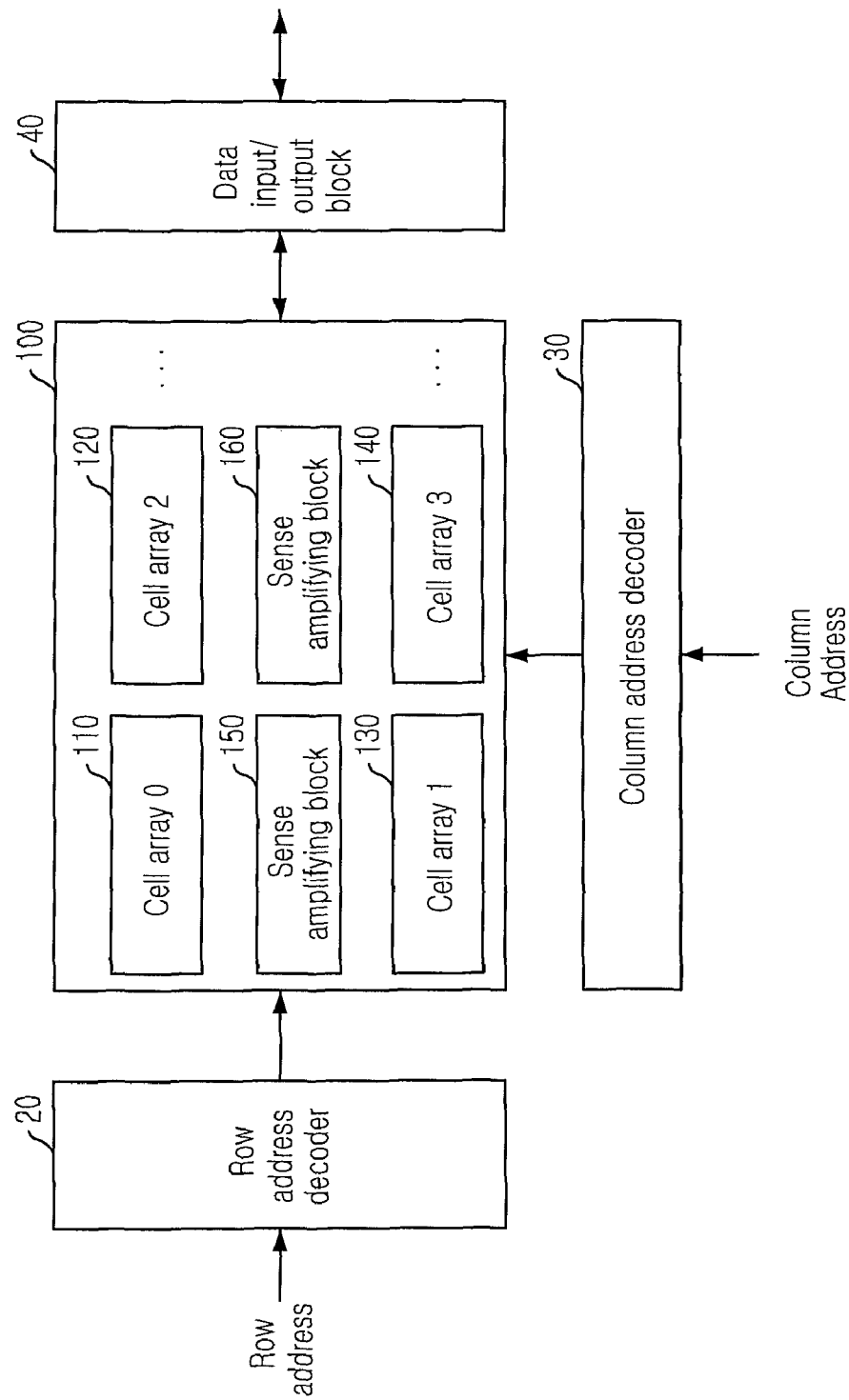
FIG. 1 is a block diagram describing a conventional semiconductor memory device.
Figure 2:
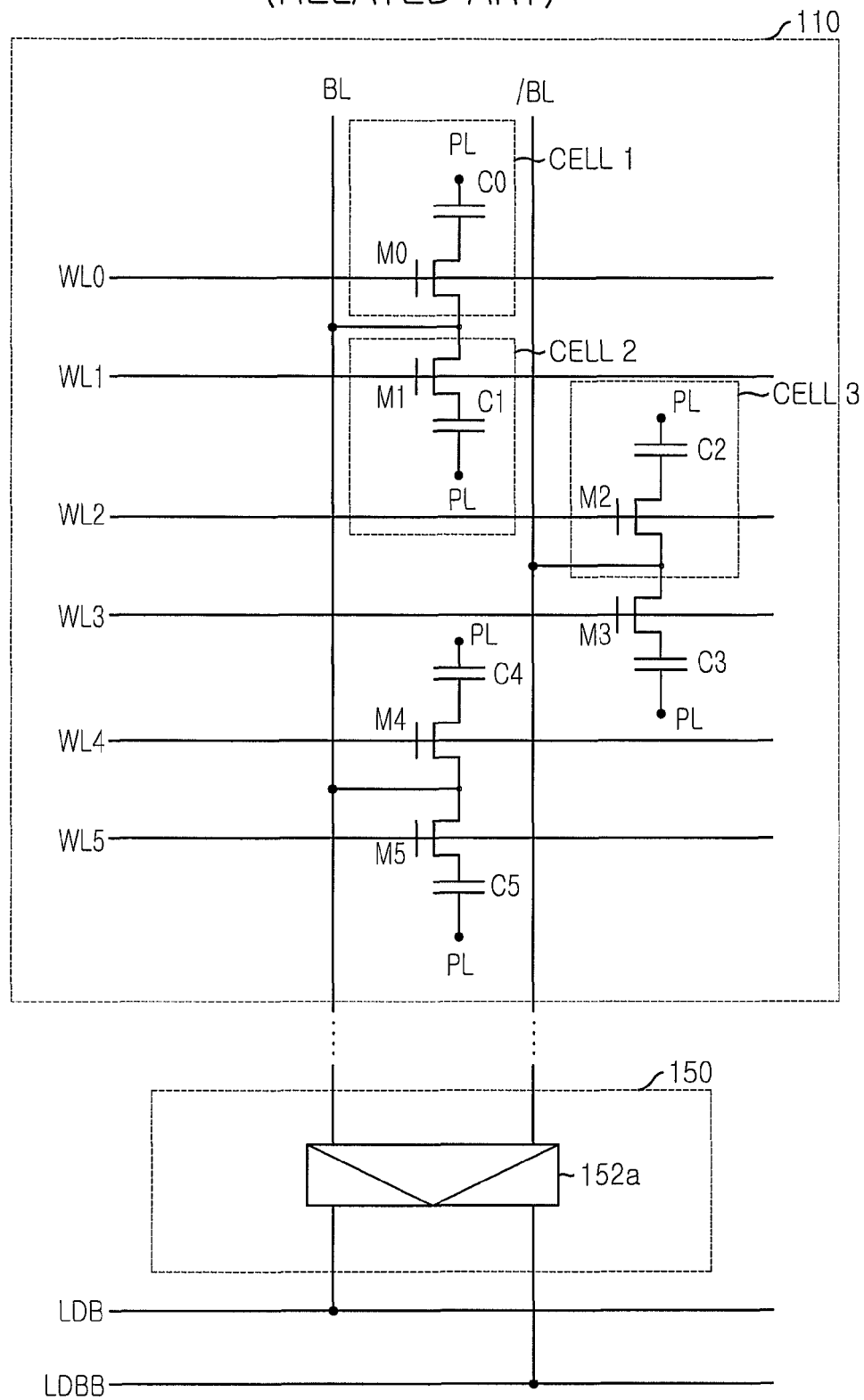
FIG. 2 is a block diagram depicting a detailed structure of a cell array shown in FIG. 1.
Figure 3:
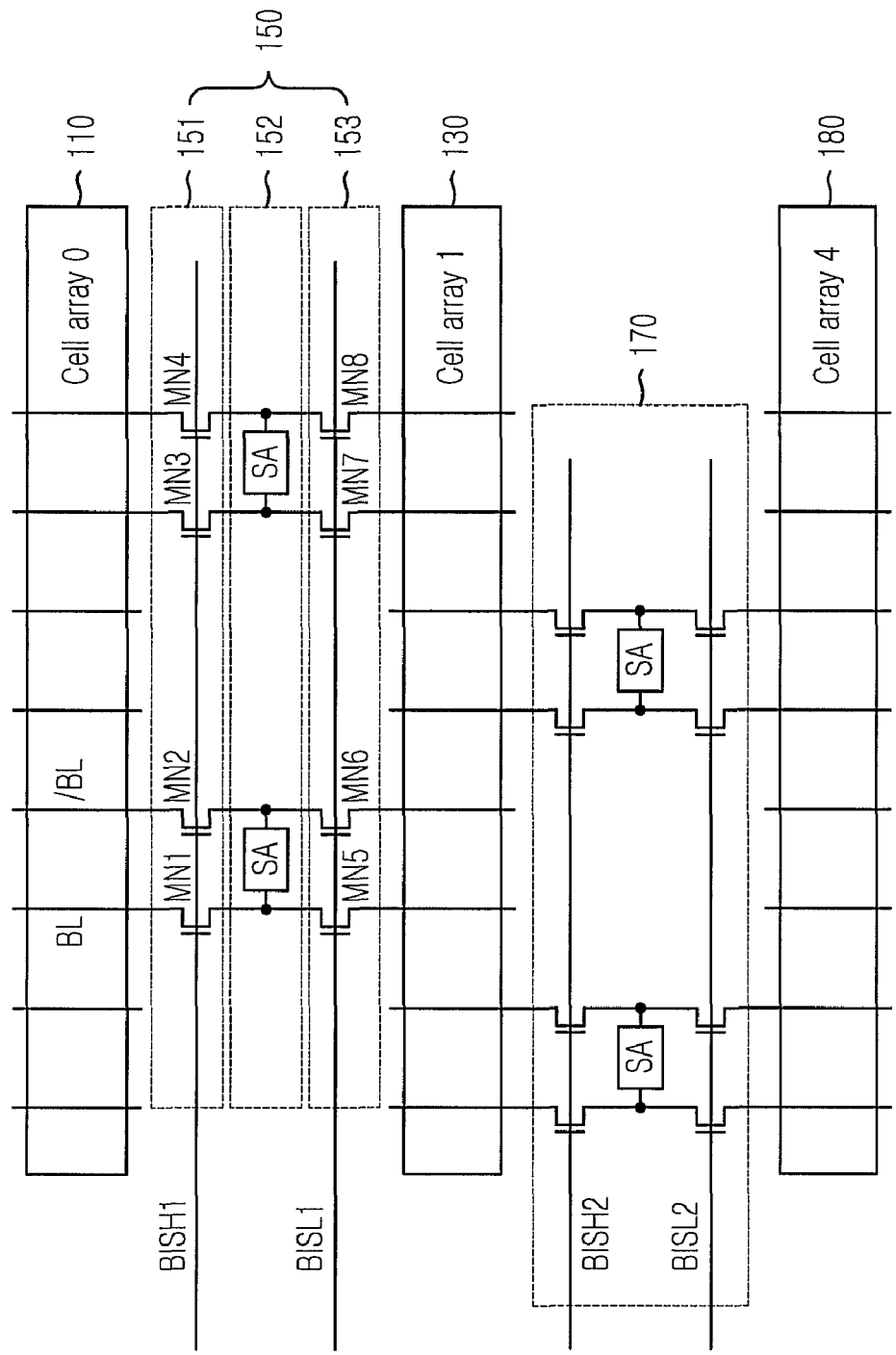
FIG. 3 is a block diagram describing a connection between each cell array and each sense amplifying block included in the cell area shown in FIG. 1.
Figure 4:
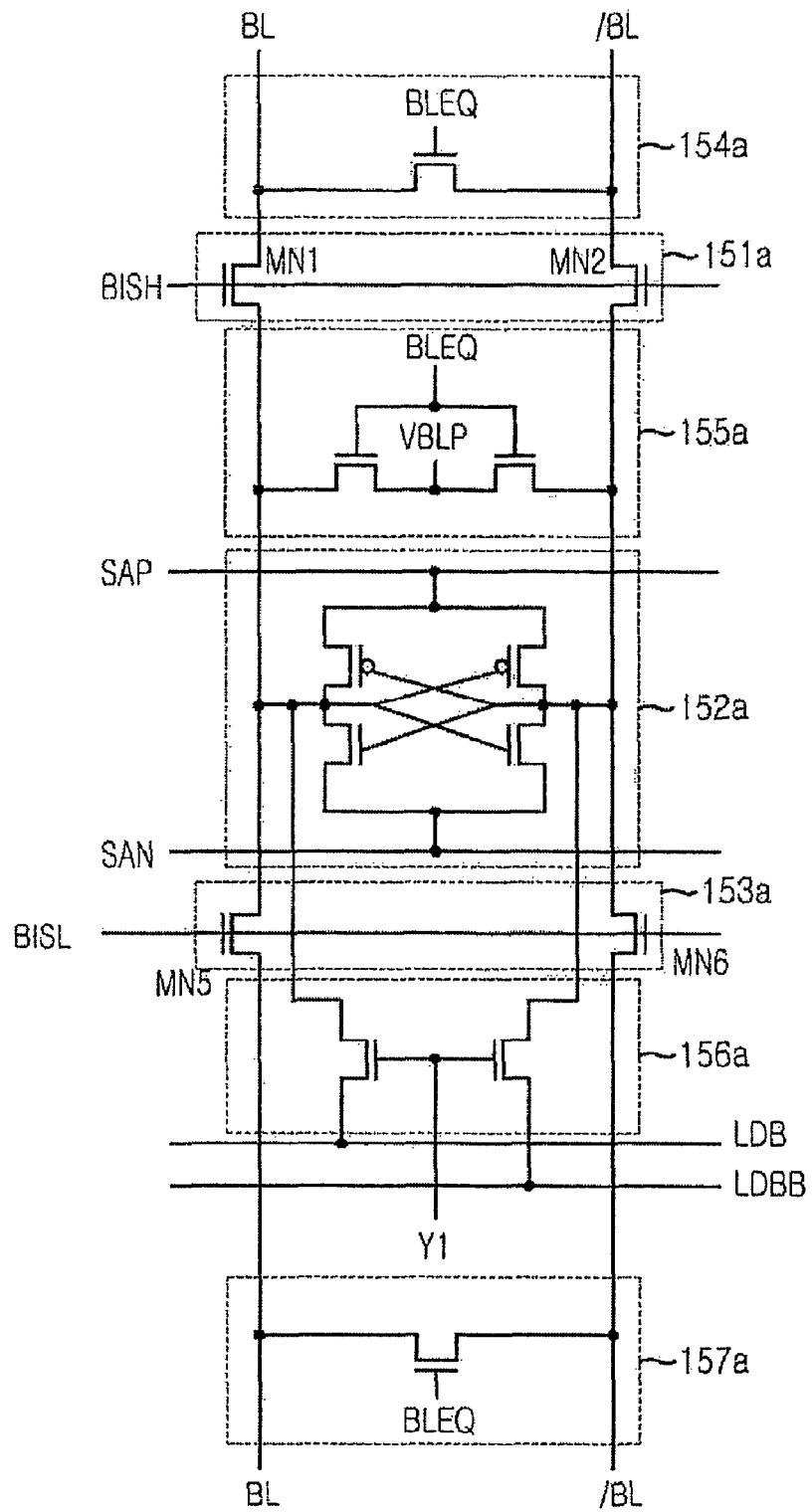
FIG. 4 is a block diagram showing the sense amplifying block 150 shown in FIG. 2.
Figure 5:
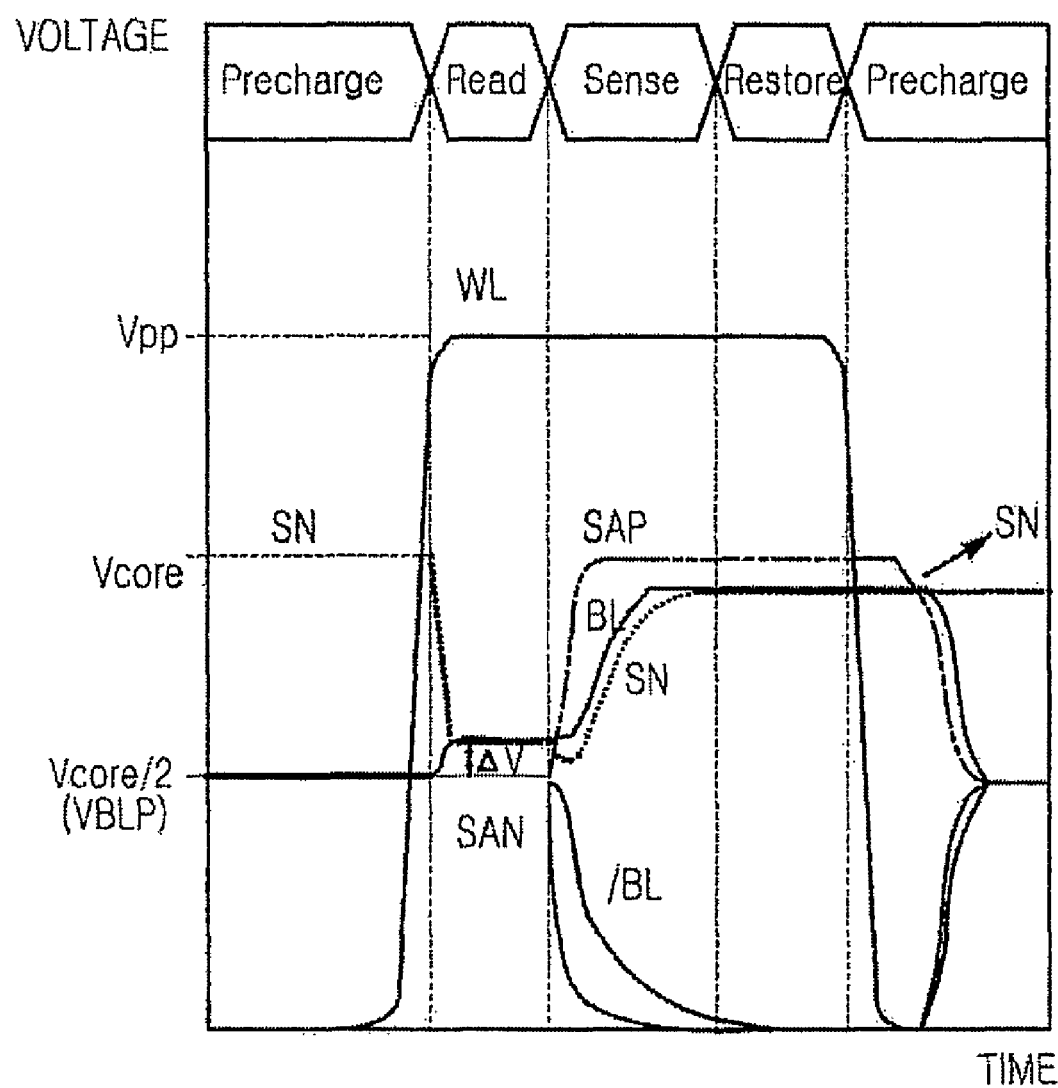
FIG. 5 is a waveform showing an operation of the conventional semiconductor memory device.
Figure 6:
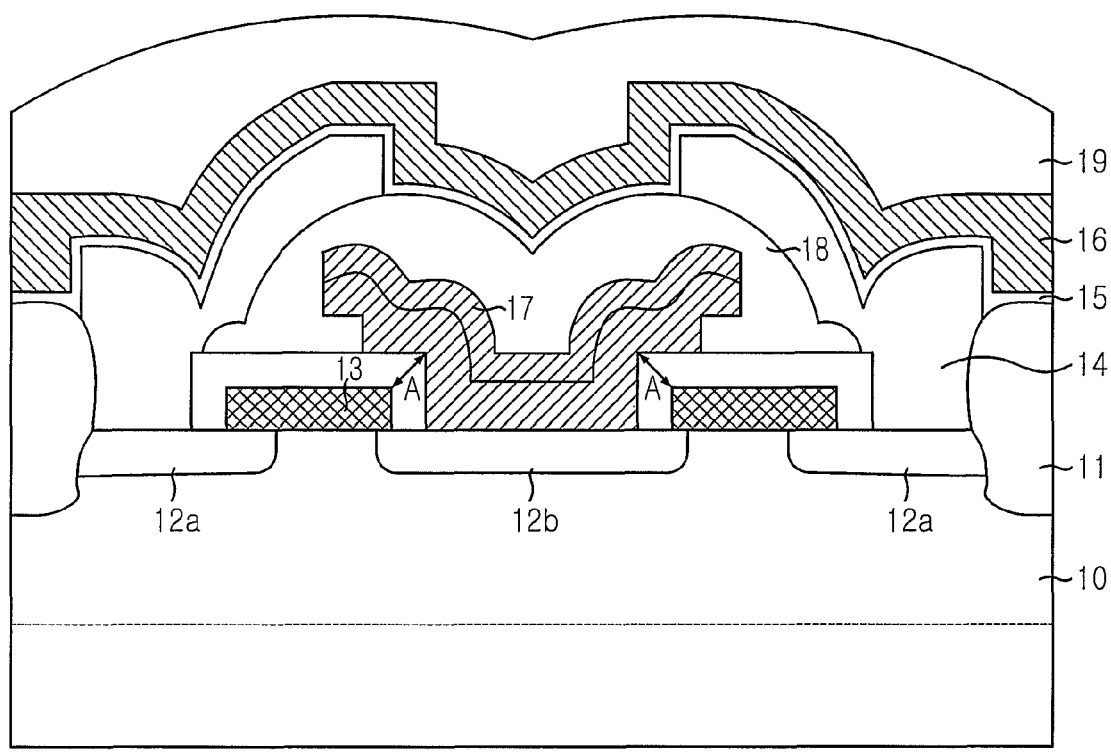
FIG. 6 is a cross-sectional view describing a unit cell of the semiconductor memory device in order to show a cause of the bleed current.
Figure 7:
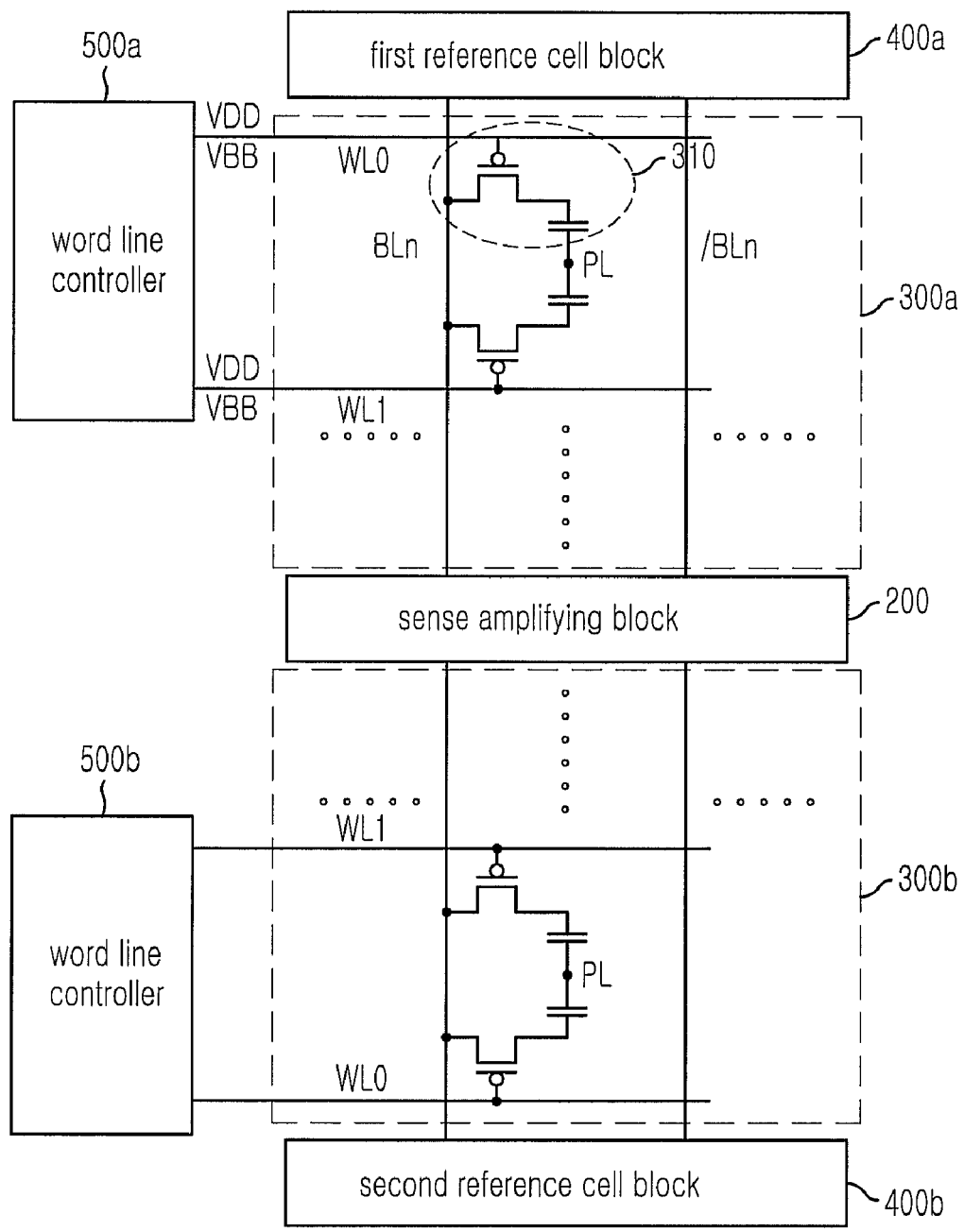
FIG. 7 is a block diagram showing a semiconductor memory device in accordance with an embodiment of the present invention.

FIG. 7 is a block diagram showing a semiconductor memory device in accordance with an embodiment of the present invention.

As shown, the semiconductor memory device includes a plurality of cell arrays, e.g., 300a and 300b, a plurality of sense amplifying blocks, e.g., 200. The semiconductor memory device further includes word line controllers, e.g., 500a and 500b, and reference cell blocks, e.g., 400a and 400b, corresponding to the cell arrays.

In detail, each cell array, e.g., 300a, includes a plurality of unit cells, e.g., 310, each provided with a PMOS transistor and a capacitor. The PMOS transistor included in each unit cell connected to a corresponding word line WL0 and WL1, driven based on a low voltage VBB and a power supply voltage VDD.

The word line controller 500a and 500b determines a voltage transmitted to the word line WL0 and WL1. That is, the word line controller transmits the low voltage VBB to a word line when an inputted row address corresponds to the word line; and transmits the power supply voltage VDD when the word line is not activated. As described, the word line is driven by the low voltage VBB because of the PMOS transistor included in the unit cells.

The PMOS transistor is turned on in response to a negative voltage and, therefore, has a possibility to lose a low data. To prevent abovementioned low data loss, a word line connected to the PMOS transistor is driven by a low voltage whose voltage level is lower than a ground voltage by an absolute value of a threshold voltage level of the PMOS transistor. For example, if a threshold voltage is about 0.7V, the low voltage VBB becomes about −0.7V. In actual case the PMOS transistor of about −2.0V is used in order to guarantee a reliable operation of the PMOS transistor.

The PMOS transistor included in the cell arrays of the embodiment of the present invention can be implemented with a general MOS transistor which has carrier under a gate or a finFET. The finFET includes a fin pattern connecting a drain and a source and a gate surrounding the fin pattern. The finFET performs operation reliably because a channel is formed on three sides of the fin pattern.

The sense amplifying block 200 for sensing and amplifying a data loaded at a bit line pair BLn and /BLn is shared by two neighboring cell arrays, e.g., 300*a* and 300*b*. Therefore, the sense amplifying block 200 includes connection units for selectively connecting the cell arrays and the sense amplifying block 200.

Bit lines of the semiconductor memory device in accordance with an embodiment of the present invention are in a floating state during a precharge step because any precharge voltage is not supplied to the bit lines. Therefore, the reference cell block 400*a* and 400*b* transmits a reference voltage to the bit line bar /BL in order to correctly sense the data loaded at the bit line BL.

Figure 8:
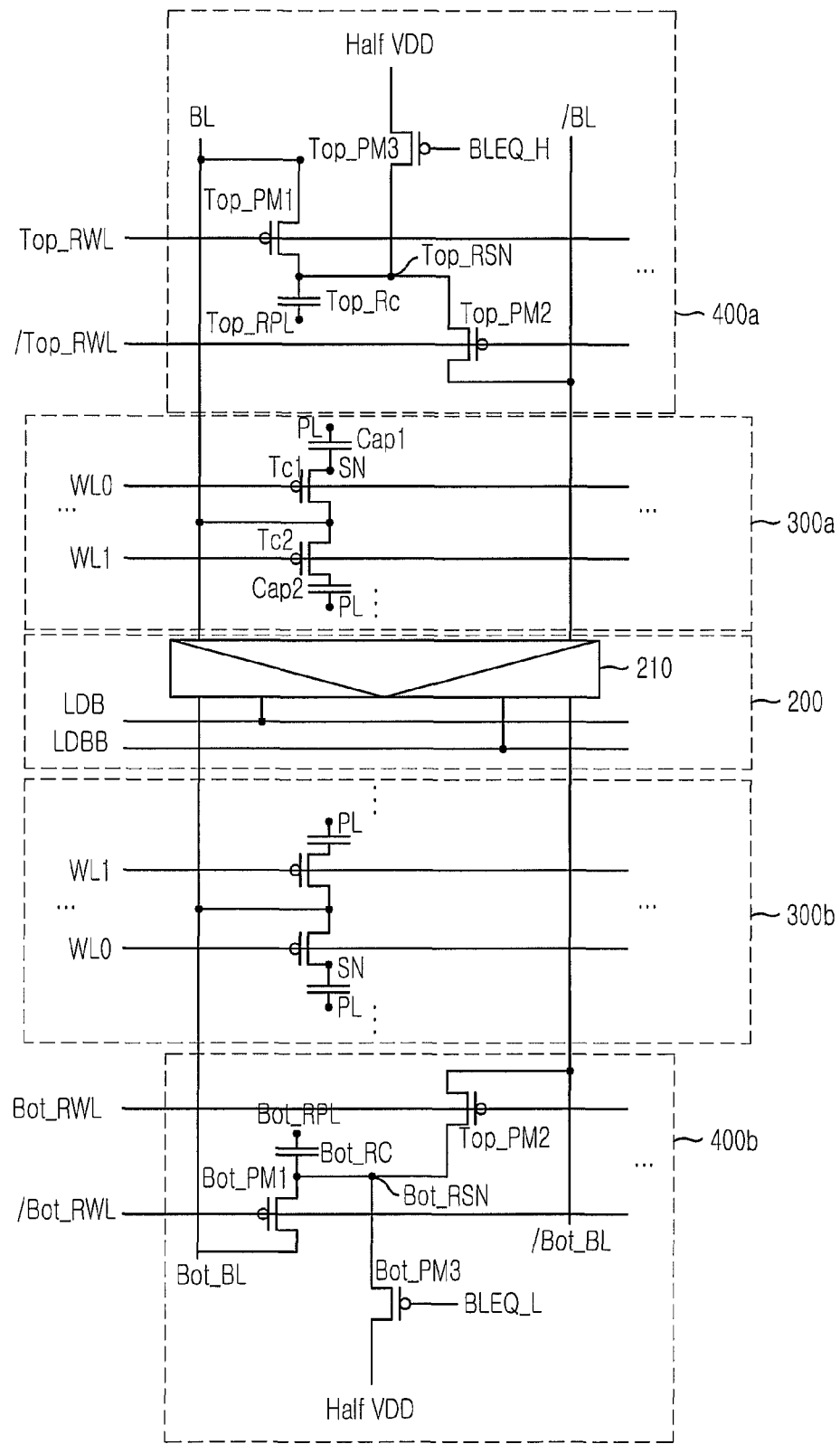
FIG. 8 is a block diagram for depicting the semiconductor memory device shown in FIG. 7 in detail.

FIG. 8 is a block diagram for depicting the semiconductor memory device shown in FIG. 7 in detail.

The semiconductor memory device having a folded bit line structure receives a power supply voltage VDD and a ground voltage VSS for operating and includes a plurality of unit cells each having a PMOS transistor Tc1/Tc2 and a capacitor Cap1/Cap2 connected through a storage node SN to each other.

In detail, the semiconductor memory device includes a first cell array 300*a* for storing data and for outputting a data signal to a bit line pair BL and /BL; a sense amplifying block 200 having a bit line sense amplifier 210 for sensing and amplifying the data signal loaded on one of the first bit line BL and the first bit line bar /BL by amplifying a potential difference between the first bit line BL and the first bit line bar /BL; and a first reference cell block 400*a* for transferring a reference signal to the first bit line bar /BL when the data signal is outputted to the first bit line BL or to the first bit line BL when the data signal is outputted to the first bit line bar /BL.

Meanwhile, in accordance with the preferred embodiment, the bit line sense amplifier is commonly coupled two neighboring cell arrays. Therefore, the semiconductor memory device further includes a second cell array 300*b* and a second reference cell block 400*b*. Since the second reference cell block 400*b* operates similar to the first reference cell block 400*b*, the description in detail will be omitted.

The first reference cell block 400*a* includes a reference capacitor Top_RC whose one terminal is coupled to a reference power supply terminal Top_RPL; a first reference switching PMOS transistor Top_PM1 for connecting the other terminal of the reference capacitor Top_RC to the first bit line BL when a data signal is delivered to the first bit line bar /BL, i.e. in response to a signal Top_RWL; and a second reference switching PMOS transistor Top_PM2 for connecting the other terminal of the reference capacitor Top_RC to the first bit line bar /BL when a data signal is delivered to the first bit line BL, i.e. in response to a signal Top_RWL.

The first reference cell block 400*a* may further include a third reference switching PMS transistor Top_PM3 to supply a half of a power supply voltage Half VDD through a node Top_RSN in response to a precharge signal BLEQ_H.

Herein, a capacitance of the reference capacitor Top_RC is substantially same with that of a unit cell capacitor, e.g., Cap1, included in the first cell array 300*a*. A voltage level at the reference power supply terminal Top_RPL is one of the ground voltage VSS, a half of the power supply voltage VDD and the power supply voltage VDD.

The number of reference capacitors included in the first reference cell block 400*a* corresponds to the number of bit line pairs included in a corresponding cell array, i.e., the first cell array 300*a*. For instance, if the first cell array 300*a* includes 256 bit line pairs, the first reference cell block 400*a* includes 256 reference capacitors. Each reference capacitor is coupled to one of a corresponding bit line pair which carries no data signal to thereby deliver a reference signal stored in the reference capacitor to the coupled bit line.

Figure 9:
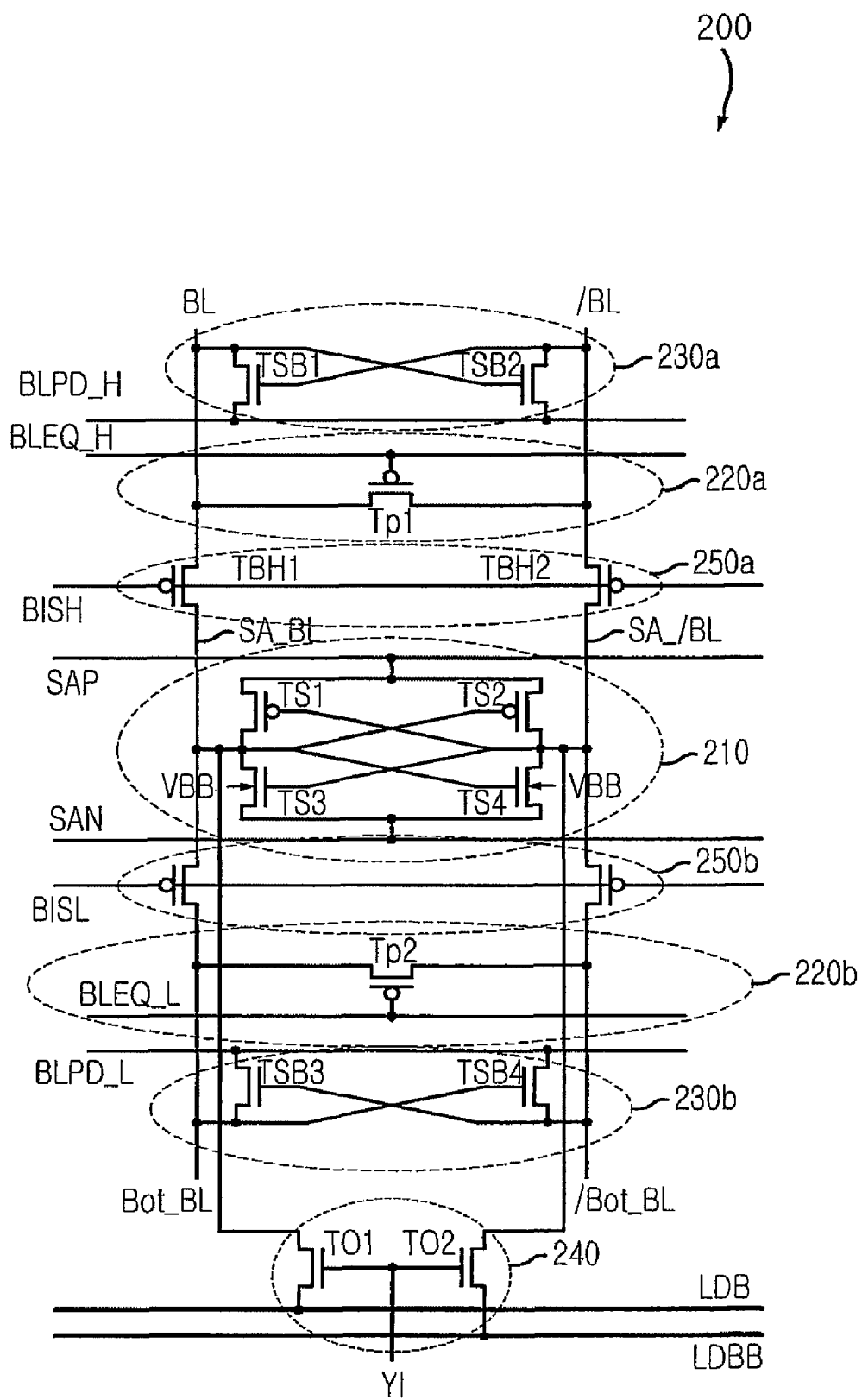
FIG. 9 is a schematic circuit diagram depicting a sense amplifying block shown in FIG. 7.

FIG. 9 is a schematic circuit diagram depicting a sense amplifying block shown in FIG. 7.

As shown, the sense amplifying block 200 includes a bit line sense amplifier 210, a first and a second precharge units 220*a* and 220*b*, a first and a second auxiliary bit line sense amplifiers 230*a* and 230*b*, a data input/output unit 240, and a first and a second connection units 250*a* and 250*b*.

The first precharge unit 220*a* equalizes a potential difference between the first bit line pair BL and /BL coupled to the first cell array 300*a* at a precharge operation. That is, the first precharge unit 220*a* floats the first bit line bit line pair BL and /BL not providing a precharge voltage to the first bit line bit line pair BL and /BL at the precharge operation. Herein, the first precharge unit 220*a* includes a first PMOS transistor Tp1 for connecting the first bit line BL to the first bit line bar /BL at the precharge operation.

The first connection unit 250*a* connected between the bit line sense amplifier 210 and the first precharge unit 220*a* connects/disconnects the first bit line pair BL and /BL included in the first cell array 300*a* to/from the bit line sense amplifier 210.

The first connection unit 250*a* includes a second PMOS transistor TBH1 for connecting the bit line BL to the bit line sense amplifier 210 in response to a first connection control signal BISH; and a third PMOS transistor TBH2 for connecting the bit line bar /BL to the bit line sense amplifier 210 in response to the first connection control signal BISH.

The first auxiliary bit line sense amplifier 230*a* amplifies and maintains a voltage level of one of the first bit line BL and the first bit line bar /BL included between the first cell array 300*a* and the first connection unit 250*a*, which has a smaller voltage level than the other, as a voltage level of the ground voltage VSS. A signal BLPD_H inputted to the first auxiliary bit line sense amplifier 230*a* has a voltage level of the ground voltage VSS while the bit line sense amplifier is operated.

In detail, the first auxiliary bit line sense amplifier 230*a* includes a first auxiliary MOS transistor TSB1 and a second auxiliary MOS transistor TSB2.

One terminal of the first auxiliary MOS transistor TSB1 receives the signal BLPD_H which is activated when the bit line sense amplifier 210 is enabled and the other terminal is coupled to the first bit line BL connected between the first cell array 300*a* and the first connection unit 250*a*. A gate of the first auxiliary MOS transistor TSB1 is coupled to the first bit line bar /BL connected between the first cell array 300*a* and the first connection unit 250*a*. Similarly, one terminal of the second auxiliary MOS transistor TSB2 receives the signal BLPD_H which is activated when the bit line sense amplifier 210 is enabled and the other terminal is coupled to the first bit line bar /BL connected between the first cell array 300*a* and the first connection unit 250*a*. A gate of the second auxiliary MOS transistor TSB2 is coupled to the first bit line BL connected between the first cell array 300*a* and the first connection unit 250*a*.

Meanwhile, in accordance with the preferred embodiment, a cell array has a folded structure and also has a shared structure, i.e., a bit line sense amplifier is commonly coupled two neighboring cell arrays. Therefore, the semiconductor memory device further includes a second cell array 300b coupled to the other side of the bit line sense amplifier 210; and a second reference cell block 400b.

Similar to the first cell array 300a, the second cell array 300b stores data and outputs a data signal to a selected second bit line Bot_BL or a second bit line bar /Bot_BL.

Herein, the semiconductor memory device further includes a second reference cell block 400b for transferring a reference signal to the second bit line bar /Bot_BL when the data signal is outputted to the second bit line Bot_BL or to the second bit line Bot_BL when the data signal is outputted to the second bit line bar /Bot_BL.

Meanwhile, the sense amplifying unit 200 further includes the second precharge unit 220b, the second auxiliary bit line sense amplifier 230b, and the second connection unit 250b for connecting/disconnecting the second cell array 300b to/from bit line sense amplifier 210 in response to a second connection control signal BISL.

The second precharge unit 220b equalizes a potential difference between the second bit line Bot_BL and the second bit line bar /Bot_BL included in the second cell array 300b at the precharge operation. That is, the second precharge unit 220b floats the second bit line Bot_BL and the second bit line bar /Bot_BL not proving a precharge voltage to the second bit line Bot_BL and the second bit line bar /Bot_BL at the precharge operation. Herein, the second precharge unit 220b includes a fourth PMOS transistor Tp2 for connecting the second bit line Bot_BL to the second bit line bar /Bot_BL at the precharge operation.

The second auxiliary bit line sense amplifier 230b connected between the second cell array 300b and the bit line sense amplifier 210 amplifies and maintains a voltage level of one of the second bit line Bot_BL and the second bit line bar /Bot_BL included between the second cell array 300b and the second connection unit 250b, which has a smaller voltage level than the other, as a voltage level of the ground voltage VSS.

In detail, the second auxiliary bit line sense amplifier 230b includes a first auxiliary NMOS transistor TSB3 and a second auxiliary NMOS transistor TSB4.

One terminal of the first auxiliary NMOS transistor TSB3 receives a signal BLPD_L which is activated when the bit line sense amplifier 210 is enabled and the other terminal is coupled to the second bit line Bot_BL connected between the second cell array 300b and the second connection unit 250b. A gate of the first auxiliary NMOS transistor TSB3 is coupled to the second bit line bar /Bot_BL connected between the second cell array 300b and the second connection unit 250b. Similarly, one terminal of the second auxiliary NMOS transistor TSB4 receives the signal BLPD_L which is activated when the bit line sense amplifier 210 is enabled and the other terminal is coupled to the second bit line bar /Bot_BL connected between the second cell array 300b and the second connection unit 250b. A gate of the second auxiliary NMOS transistor TSB4 is coupled to the second bit line Bot_BL connected between the second cell array 300b and the second connection unit 250b.

Meanwhile, the bit line sense amplifier 210 includes a first and a second sense amplifying PMOS transistors TS1 and TS2 and a first and a second sense amplifying NMOS transistors TS3 and TS4.

A gate of the first sense amplifying PMOS transistor TS1 is connected to the first bit line bar /BL by the first connection unit 250a or to the second bit line bar /Bot_BL by the second connection unit 250b. One terminal of the first sense amplifying PMOS transistor TS1 receives the power supply voltage VDD and the other terminal is connected to the first bit line BL by the first connection unit 250a or to the second bit line Bot_BL by the second connection unit 250b.

Similarly, a gate of the second sense amplifying PMOS transistor TS2 is connected to the first bit line BL by the first connection unit 250a or to the second bit line Bot_BL by the second connection unit 250b. One terminal of the second sense amplifying PMOS transistor TS2 receives the power supply voltage VDD and the other terminal is connected to the first bit line bar /BL by the first connection unit 250a or to the second bit line bar /Bot_BL by the second connection unit 250b.

A gate of the first sense amplifying NMOS transistor TS3 is connected to the first bit line bar /BL by the first connection unit 250a or to the second bit line bar /Bot_BL by the second connection unit 250b. One terminal of the first sense amplifying NMOS transistor TS3 receives a first low voltage VBB and the other terminal is connected to the first bit line BL by the first connection unit 250a or to the second bit line Bot_BL by the second connection unit 250b.

Similarly, a gate of the second sense amplifying NMOS transistor TS4 is connected to the first bit line BL by the first connection unit 250a or to the second bit line Bot_BL by the second connection unit 250b. One terminal of the second sense amplifying NMOS transistor TS4 receives the first low voltage VBB and the other terminal is connected to the first bit line bar /BL by the first connection unit 250a or to the second bit line bar /Bot_BL by the second connection unit 250b.

Herein, the first low voltage VBB has a lower voltage level than the ground voltage VSS, where the first low voltage VBB has a voltage level of about −0.5V. The bit line sense amplifier 210 performs a sensing and amplifying operation by using the first low voltage VBB and the power supply voltage VDD. The bit line sense amplifying unit amplifies the data signals stored in the unit cells based on a power supply voltage and a second low voltage which is higher than the first low voltage and lower than the ground voltage.

Meanwhile, a PMOS transistor included in a unit cell, e.g., TC1, is turned on in response to a second low voltage VBBW which is lower than the first low voltage VBB, where the second low voltage VBBW has a voltage level of about −2.0V. A selected unit cell included in the first cell array 300a is activated by turning on a PMOS transistor included in the selected unit cell by using the second low voltage VBBW and the selected unit cell is inactivated by turning off the PMOS transistor by using the power supply voltage VDD.

Meanwhile, the semiconductor memory device further includes a data input/output unit 240 for outputting a data sensed and amplified by the bit line sense amplifier 210 through a data line (LDB, LDBB) and for delivering a data inputted from the data line to the bit line sense amplifier 210. The data signal sensed and amplified by the bit line sense amplifying unit is outputted through a data line in response to a read command. Also, the data signal latched by the bit line sense amplifying unit is replaced with a data signal transmitted through a data line in response to a write command.

In detail, the data input/output unit 240 includes a first and a second input/output MOS transistors TO1 and TO2. A gate of the first input/output MOS transistor TO1 receives an input/output control signal. One terminal of the first input/output MOS transistor TO1 is connected to the first and the second bit lines BL and Bot_BL and the other terminal of the first input/output MOS transistor TO1 is coupled to a first data line LDB. Similarly, a gate of the second input/output MOS transistor TO2 receives the input/output control signal; and one terminal of the second input/output MOS transistor TO2 is connected to the first and the second bit line bars /BL and /Bot_BL and the other terminal of the second input/output MOS transistor TO2 is coupled to a second data line LDBB.

Figure 10:
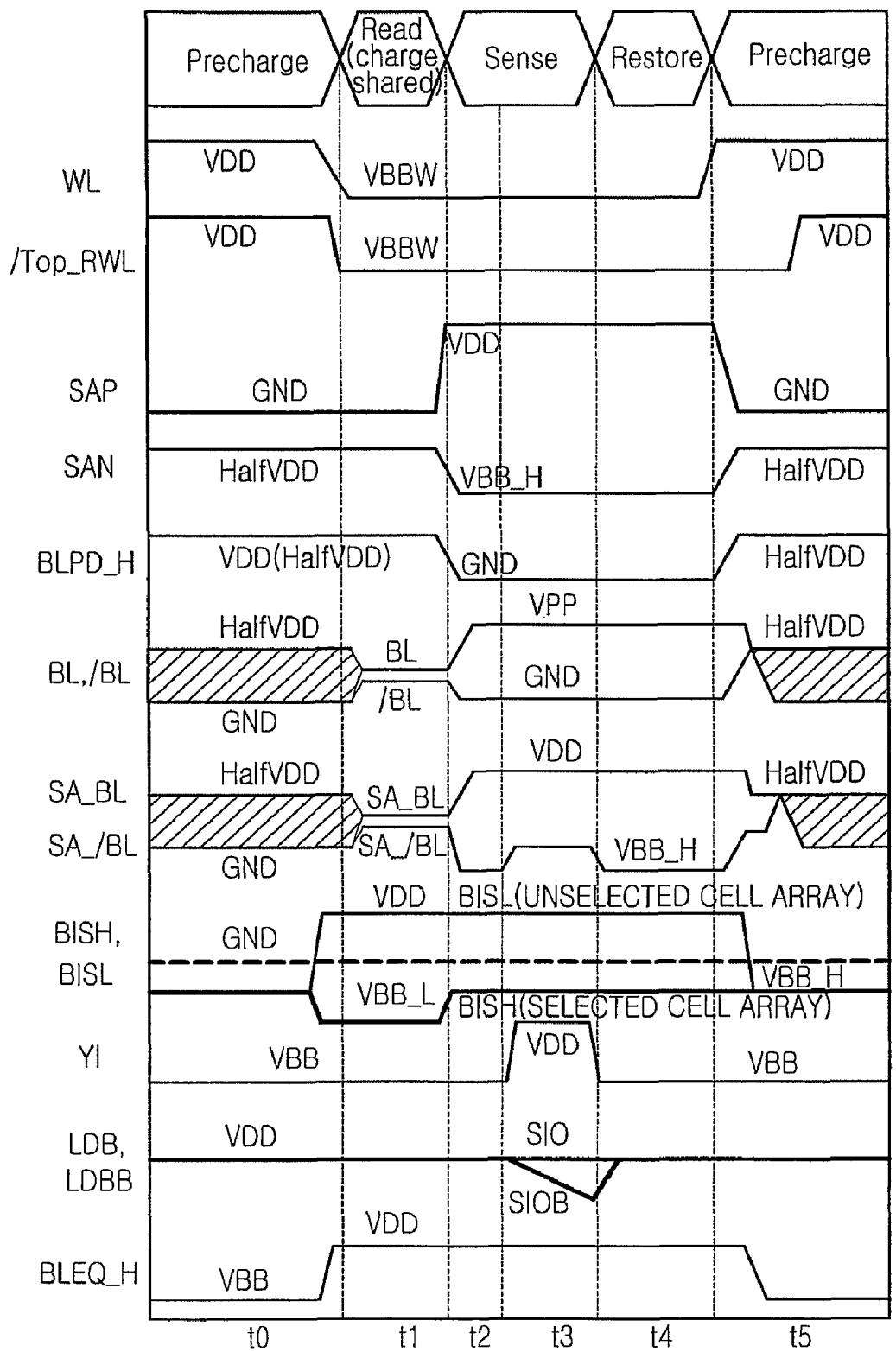
FIG. 10 is a waveform showing an operation of the semiconductor memory device when the semiconductor memory device performs a read operation.
Figure 11:
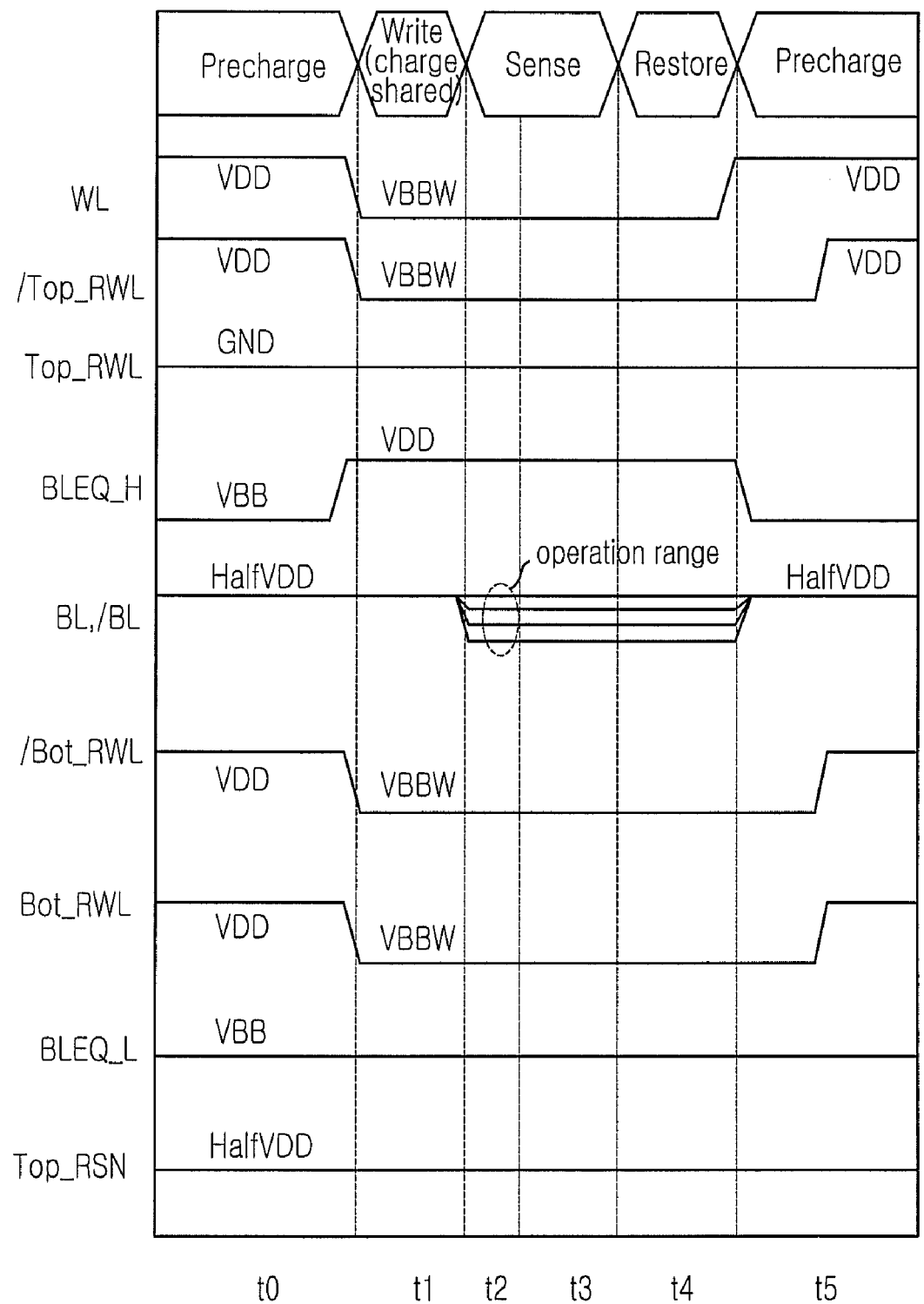
FIG. 11 is a waveform showing an operation of the semiconductor memory device when the semiconductor memory device performs a write operation.

FIGS. 10 and 11 are waveforms respectively showing a read and a write operation of the semiconductor memory device.

Referring to FIGS. 7 to 11, the operations of the semiconductor memory device are described below.

As abovementioned, each of the unit cells in accordance with the embodiment of the present invention is implemented with a PMOS transistor and a capacitor. Therefore, the low voltage VBB, e.g., 2V, is used for activating a word line and the power supply voltage VDD is used for deactivating the word line.

Further, the connection units 250a and 250b and the precharge units 220a and 220b are provided with PMOS transistors. Thus, the PMOS transistors included in the connection units 250a and 250b and the precharge units 220a and 220b can be configured in an N-well provided for unit cells.

Meanwhile, the semiconductor memory device floats a bit line and a bit line bar without providing a precharge voltage to the bit line and the bit line bar at the precharge operation. For this operation, a reference cell bock is included.

The bit line sense amplifier performs a sensing and amplifying operation by using the power supply voltage VDD and the low voltage VBB which is lower than the ground voltage GND. If a voltage level of the power supply voltage is more decreased, it is possible that an absolute quantity of the power supply voltage VDD is equal to that of the low voltage VBB. In this case, a precharge voltage level of a bit line is maintained as the ground voltage VSS if voltage levels of two bit lines are maintained same after a sensing operation of the bit line sense amplifier.

The semiconductor memory device includes an auxiliary bit line sense amplifier for maintaining a voltage level of a neighboring bit line pair as a half of VDD by using a reference cell block and a precharge unit when the bit line sense amplifier is operated for a data access.

Hereinafter, the above-mentioned operations of the semiconductor memory device are described in detail. Herein, it is assumed that a read operation is performed for reading a high-level data '1', and the data is transferred to the first bit line BL.

A data access operation of the semiconductor memory device can be classified into four steps: a precharge step, a read/write step, a sense step, and a restore step.

At the precharge step, precharge signals BLEQ_H and BLEQ_L are activated and, thus, voltage levels of the first bit line BL and the first bit line bar /BL are equalized and voltage levels of a first bit line Top_BL and a first bit line bar /Top_BL are also equalized.

As above-mentioned, since a particular precharge voltage is not provided at the precharge step, bit line pairs BL and /BL, SA_BL and SA_/BL and Bot_BL and /Bot_BL are floated (t0). At this time, the first and the second connection units 250a and 250b are turned on.

Therefore, the bit line pairs BL and /BL, SA_BL and SA_/BL and Bot_BL and /Bot_BL keep a voltage level of about half of the power supply voltage VDD at the precharge step by using enabled precharge units 220a and 220b right after a read/write operation is performed. That is, after a sensing and amplifying operation is performed by the bit line sense amplifier, one of a bit line pair has a voltage level of the power supply voltage VDD and the other has a voltage level of the ground voltage GND. Thereafter, since a particular precharge voltage is not provided, the bit line voltage level of half of the power supply voltage VDD is decreased if a period of the precharge step is longer. If the precharge step is more continuously performed not entering the read step, the voltage level of the bit line pairs BL and /BL and SA_BL and SA_/BL is decreased to the ground voltage GND.

Therefore, a precharge voltage of a floated bit line has a variable voltage level between the half of the power supply voltage VDD and the ground voltage GND. As a result, a timing of performing the read step determines the precharge voltage of the floated bit line.

Thereafter, at the read step, a single word line is selected by decoding an inputted address. The second low voltage VBBW of about −2.0V is inputted to the selected word line. The absolute value of the second low voltage VBBW is greater than that of the threshold voltage of the PMOS transistor included in unit cells.

All the MOS transistors corresponding to the selected word line are turned on and a data stored in a capacitor is transferred to the bit line BL through a turned-on MOS transistor.

If the data, i.e., '1', is delivered to the bit line BL, voltage levels of the bit lines BL and SA_BL, which have a voltage level between the half of the power supply voltage VDD and the ground voltage GND as above-mentioned, are increased by an amount of a signal level of the data.

Meanwhile, a reference signal is inputted to the bit lines /BL and SA_/BL which have no data signal. A reference word line /Top_RWL having no data signal is activated as the second low voltage VBBW and, thus, the second reference MOS transistor Top_PM2 is turned on. Accordingly, the reference signal stored in the reference capacitor Top_RC is transferred to the bit lines /BL and SA_/BL and, thus, voltage levels of the bit lines /BL and SA_/BL are increased by an amount of a predetermined voltage level. At this time, similar to the bit lines BL and SA_BL, voltage levels of the bit lines /BL and SA_/BL is decreased from the half of the power supply voltage before the input of the reference signal and, then, voltage levels of the bit lines /BL and SA_/BL are increased by an amount of a signal level of the reference signal.

As above-mentioned, a capacitance of the reference capacitor Top_RC is substantially same to that of a unit cell capacitor Cap. A charge amount of the reference capacitor Top_RC which stores the reference signal is half of a charge amount of the unit cell capacitor Cap which stores the data '1'. That is, reference power supply terminals, i.e., HalfVDD, Top_RPL and Bot_RPL, receive a voltage level of VDD/2, a charge amount of the reference capacitor Top_RC which stores the reference signal is half of a charge amount of the unit cell capacitor Cap which stores the data '1'. At this time, a voltage level supplied by the reference power supply terminals Top_RPL and Bot_RPL is same to a voltage level of a plate voltage PL of a unit cell capacitor included in a cell array. At this time, the voltage level can have a voltage level of VDD, VDD/2 or GND. A voltage level which is same to the plate voltage PL is supplied to a reference signal power supply terminal VCP so that the reference signal can have a half signal level of the data signal.

Accordingly, a signal level increased of the bit line bar /BL which receives the reference signal is half of that of the bit line BL which receives the data signal. For instance, when the power supply voltage is 1.0V and there is a voltage increase by 0.2V due to the data signal, the bit lines BL and /BL have a voltage level of about 0.5V at an initial state of the precharge step. Thereafter, as the precharge step is continued, a voltage level of the bit lines BL and /BL is decreased to about 0.3V. At this time, if a read command is performed, a voltage level of the bit line BL having the data signal is increased to about 0.5V (=0.3V+0.2V) and a voltage level of the bit line bar /BL having the reference signal is increased to 0.4V (=0.3V+0.1V).

Meanwhile, the precharge signal BLEQ_H is inputted as an activated state of the low voltage VBB in order to enable the first precharge unit 220a during the precharge step and is inputted as an inactivated state of the power supply voltage in order to disable the first precharge unit 220a during the read, sense and restore steps.

Next, at the sense step, a first sense amplifier power supply terminal SAP of the bit line sense amplifier 210 receives the power supply voltage VDD and a second sense amplifier power supply terminal SAN receives the low voltage VBB.

Therefore, the bit line sense amplifier 210 sense a voltage difference between the bit lines BL and /BL to thereby amplify a voltage level of a bit line having a higher voltage level, i.e., the bit line BL, to a voltage level of a high voltage VPP and amplify a voltage level of the bit line bar /BL to the ground voltage GND (t2).

Since the bit line sense amplifier 210 performs the amplifying operation by using the high voltage VPP and the low voltage VBB, the amplifying operation can be performed at a high speed in comparison with using the power supply voltage VDD and the ground voltage GND.

Herein, a voltage level of the bit line SA_/BL included between the bit line sense amplifier 210 and the second connection unit 250b is amplified to the negative low voltage VBB; however, the bit line /BL included between the first cell array 300a and the first connection unit 250a is amplified to the ground voltage GND. Since the first connection control signal BISH inputted to each gate of the second and the third PMOS transistors TSH1 and TSH2 included in the first connection unit 250a has a voltage level of a low voltage VBB_H, even though the bit line SA_/BL coupled to the bit line sense amplifier 210 is amplified to the low voltage, the bit line /BL coupled to the first cell array 300a is amplified to the ground voltage which is higher than the low voltage.

Accordingly, the second connection unit 250b performs a clamping operation so that a low voltage level is not transferred to the second cell array 300b even though the bit line sense amplifier 210 amplifies the bit line SA_/BL to the low voltage VBB. Also, since a parasitic capacitance is relatively smaller than a sub-threshold voltage of the second and the third PMOS transistors TSH1 and TSH2 included in the first connection unit 250a, the bit line /BL coupled to a cell array can keep a voltage level of the ground voltage GND during the sensing and amplifying operation of the bit line sense amplifier 210 and the restore step.

Therefore, since the bit lines BL and /BL coupled to a cell array can keep a voltage level of the ground voltage by preventing the low voltage VBB amplified by the bit line sense amplifier 210 from being transferred to the bit lines BL and /BL, a voltage variation of a bit line is prevented and, thus, an operational speed of the bit line sense amplifier 210 can be improved and a power consumption due to a voltage variation of a bit line coupled to a cell array can be reduced. For this, the first and the second connection units 250a and 250b are provided not only for controlling the connection between the bit line sense amplifier 210 and a cell array but also for preventing a low voltage VBB_H from being transferred to the bit lines BL, /BL, Top_BL and /Top_BL included in a cell array.

However, the first and the second connection units 250a and 250b are not enough for stably maintaining a voltage level of the bit lines BL and /BL included in a cell array as the ground voltage GND. Therefore, the first and the second auxiliary bit line sense amplifier 230a and 230b are provided for maintaining a voltage level of the bit lines BL and /BL included in a cell array as the ground voltage GND even though the bit lines SA_BL and SA_/BL coupled to the bit lines sense amplifier 210 are amplified to the negative low voltage VBB_H.

The auxiliary bit line sense amplifier, e.g., 230a, amplifies and maintains one of the bit lines BL and /BL included in the first cell array 300a, which has a lower voltage level than the other, as the ground voltage level while the bit line sense amplifier 210 performs the sensing and amplifying operation. When the bit line sense amplifier 210 amplifies a voltage level of the bit line SA_BL to the power supply voltage VDD and amplifies a voltage level of the bit line SA_/BL to the low voltage VBB, the bit line BL keeps a voltage level of the power supply voltage and the bit line bar /BL keeps a voltage level of the ground voltage GND. At this time, the auxiliary bit line sense amplifier 230a decreases a voltage level of the bit line bar /BL to the ground voltage GND when a voltage level of the bit line bar /BL is higher than the ground voltage GND and increases a voltage level of the bit line bar /BL to the ground voltage GND when a voltage level of the bit line bar /BL is lower than the ground voltage GND.

The signals BLPD_H and BLPD_L respectively inputted to the first and the second auxiliary bit line sense amplifiers 230a and 230b are activated as the ground voltage during an activation period of the bit line sense amplifier 210 (t2, t3, t4). As above-mentioned, gates of two MOS transistors included in the auxiliary bit line sense amplifier, e.g., TSB1 and TSB2, are cross-coupled to the bit lines BL and /BL and each one terminal of the MOS transistors receives the ground voltage to thereby maintain a voltage level of a lower bit line to the ground voltage.

If each unit pixel included in cell arrays is implemented with a NMOS transistor and a capacitor and a sense amplifier amplifies a bit line pair as a power supply voltage VDD and a low voltage VBB, the NMOS transistor may be turned on in response to the low voltage VBB loaded at the bit line. Therefore, a data corresponding to unselected word line is lost. Thus, it is prevented the low voltage VBB from being transmitted to the bit line configured in cell array.

On the other hand, the unit cell in accordance with the embodiment of the present invention includes a PMOS transistor. Therefore, the PMOS transistor is not turned on even though the low voltage VBB amplified by the sense amplifier is transmitted to the cell array. Because of the reason, the bit line is not required to be classified into a bit line configured in cell arrays and a bit line amplified by the sense amplifier.

However, a driving capability of the sense amplifier must be increased to amplify the bit line configured in the cell arrays as the low voltage VBB level. In this case, an amount of power consumption increases. The semiconductor memory device in accordance with an embodiment of the present invention only amplifies the bit line configured in sense amplifying block as the low voltage VBB. Therefore, the amount of power consumption is dramatically reduced.

Meanwhile, each connection control signal inputted to the first and the second connection unit 250a and 250b has two voltage levels: one is a low voltage VBB_L having a negative voltage level whose absolute quantity is larger than a threshold voltage of a PMOS transistor included in the first and the second connection units 250a and 250b and the other is a low voltage VBB_H having a negative voltage level whose absolute quantity is equal to the threshold voltage of a PMOS transistor included in the first and the second connection units 250a and 250b.

The first and the second connection control signals BISH and BISL are inputted as the low voltage VBB_H for equalizing voltage levels of a bit line pair included in the first and the second cell arrays 300a 300b, e.g., the bit line pair BL and /BL, during the precharge step.

At the read step where first cell array 300a is connected to the bit line sense amplifier 210 and the second cell array 300b is disconnected from the bit line sense amplifier 210, the second connection control signal BISL is provided as the power supply voltage VDD to disable the second connection unit 250b and the first connection control signal BISH is activated having a voltage level of the low voltage VBB_L to enable the first connection unit 250a. Thereafter, at the sense step where the bit line sense amplifier 210 senses and amplifies a voltage difference between bit lines SA_BL and SA_/BL and the restore step, the activated first connection control signal BISH is provided as the low voltage VBB_H.

Therefore, during the sensing and amplifying operation, the relatively lower low voltage VBB_L is used for more reliable isolation between the bit line sense amplifier and a bit line coupled to a cell array and, then, the relatively higher low voltage VBB_H is used for the isolation between the bit line sense amplifier and the bit line coupled to the cell array. This is for the bit line sense amplifier to perform the sensing and amplifying operation more quickly by using the low voltage VBB_H when the bit line sense amplifier mainly performs the sensing and amplifying operation.

Thereafter, when the sensing and amplifying operation of the bit line sense amplifier 210 is completed, an input/output control signal Y1 is activated for a predetermined time. Then, in response to the input/output control signal Y1, a data signal latched by the bit line sense amplifier 210 is outputted to the first local data line pair SIO and SIOB (t3).

Thereafter, at the restore step, the data signal is restored to an original unit cell by using the data signal latched by the bit line sense amplifier 210 (t4). When the restore step is completed, a word line WL is inactivated as the power supply voltage VDD, and the first and the second sense amplifier power supply terminals SAP and SAN are respectively supplied with the ground voltage GND and a half of the power supply voltage VDD so that the bit line sense amplifier 210 is disabled.

Since the first local data line pair SIO and SIOB is precharged to the power supply voltage VDD or a half of the power supply voltage VDD while a data is not transferred, according to the prior art, a voltage level of a bit line, i.e., SA_/BL, amplified to the ground voltage by the bit line sense amplifier 210 is increased to predetermined voltage level during transferring a data amplified by the bit line sense amplifier 210. Accordingly, an enough time for the restore time should be provided for the increased voltage level of the bit line /BL to be decreased to the ground voltage. Otherwise, a wrong data can be restored to the original unit cell; particularly, if an original data is '0', the original data is restored as '1'. For overcoming the above-mentioned problem, a period of the restore step (t4) should be long according to the prior art.

However, in accordance with the present invention, since the bit line SA_BL is amplified to the low voltage VBB which is lower than the ground voltage GND, even though a current is flown to the bit line /BL coupled to the bit line sense amplifier by the first local data line pair SIO and SIOB, a voltage level of the bit line /BL coupled to the bit line sense amplifier is not increased because the flown current is compensated by the bit line having the low voltage VBB. Even though the voltage level of the bit line /BL is increased, the voltage level of the bit line /BL is not higher than a voltage level of the ground voltage GND at least. Accordingly, the period of the restore step (t4) can be decreased in comparison with the prior art.

Thereafter, when the precharge signal BLEQ H is activated as a logic high level, the bit lines BL and /BL have a same voltage level and are floated. Also, the first and the second connection signals BISH and BISL are provided as the low voltage VBB_H and, thus, all of the bit lines BL, SA_BL, Bot_BL, /BL, SA_/BL and /Bot_BL are connected (t5).

As above-mentioned, at an initial state of the precharge step, the bit lines BL and /BL keep a voltage level of a half of the power supply voltage; however, the voltage level of the bit lines BL and /BL is decreased as time passes because the bit lines BL and /BL are floated not receiving a particular precharge voltage.

Meanwhile, while the first connection unit 250a is enabled, the second reference cell block 400b and the second precharge unit 220b are enabled so that a voltage level of the second bit line Bot_BL and the second bit line bar /Bot_BL is maintained as a precharge voltage. In accordance with the present invention, while voltage levels of a bit line pair are maintained to have a same voltage level at the precharge step, the bit line pair is floated not being supplied with a special precharge voltage. Therefore, there is no particular precharge voltage which all of the bit lines keep at the precharge step.

However, the precharge voltage means a half of the power supply voltage which a bit line pair keeps when the bit line pair has a same voltage level after one of the bit line pair has a voltage level of the power supply voltage and the other has a voltage level of the ground voltage after performing a data read or write operation. That is, while the bit line sense amplifier 210 accesses a data of a unit cell, a voltage level of a bit line pair which shares the bit line sense amplifier 210 and is not connected to the bit line sense amplifier 210 is maintained as the half of the power supply voltage by using a corresponding precharge unit and a reference cell block. This operation of the reference block is shown in FIG. 11. Since a voltage level of a bit line included in an inactivated cell array is rapidly decreased due to a voltage difference between the power supply terminal (SAP) of the bit line sense amplifier which operates for accessing a data and a voltage level of the bit line included in the inactivated cell array, the above-mentioned operation is needed.

Although MOS transistors which receive the first or the second connection control signals BISL or BISH are provided between the power supply terminal SAP and the inactivated cell array, and even though the MOS transistors are turned off, a sub-current still flows and the bit line included in the inactivated cell array is rapidly decreased due to a leakage current of the sub-current. If a size of the MOS transistor is larger, the above-mentioned problem becomes more serious.

Generally, a semiconductor memory device keeps a precharge voltage as VDD/2. Herein, in a shared structure, when the bit line sense amplifier senses and amplifies a voltage difference between a bit line pair coupled to one side of the bit line amplifier for a data accessing, the other bit line pair which does not serve to access a data and is coupled to the other side of the bit line sense amplifier keeps a precharge voltage level of VDD/2. However, there occurs an error since the precharge voltage level is decreased due to a voltage difference between the precharge voltage and a ground voltage supply terminal of a bit line.

In accordance with the present invention, since a bit line pair which does not serve to access a data is floated at the precharge step, the above-mentioned problem does not occur. However, if the precharge voltage is maintained as a VDD/2, a data access operation can be performed more effectively since the precharge voltage level of VDD/2 is the most effective for sensing a high-level data and a low-level data.

Since the semiconductor memory device in accordance with the present invention maintains a voltage level of a bit line pair which neighbors with a bit line pair served for a data access as the VDD/2 by using a reference cell block and a precharge unit, all of bit line pairs which neighbor with the data accessing bit line pair can keep a voltage level of VDD/2. Accordingly, a precharge voltage can be secured no generating a particular control signal.

The above-mentioned operation of the semiconductor memory device is described on the assumption that a data '1' is read out. Hereinafter, an operation of the semiconductor memory device for read a data '0' is described below.

In case that a data to be read is '0', a capacitor of a selected unit cell is discharged. Accordingly, a voltage level of the first bit line BL receiving a data signal is not changed at the read step after the precharge step (t2). That is, a voltage level of the first bit line BL keeps a voltage level of the ground voltage.

Meanwhile, since the first bit line bar /BL receives a reference signal, a voltage level of the first bit line bar /BL is increased by a predetermined voltage level. Herein, an amount of the voltage increase of the first bit line bar /BL is determined by a charge quantity corresponding to the reference signal, i.e., a charge quantity stored in the reference capacitor Top_RC.

Thereafter, the bit line sense amplifier 210 senses the voltage difference between the first bit line BL and the first bit line bar /BL and amplifies a voltage level of the bit line BL and a voltage level of the first bit line bar /BL to the low voltage VBB and to the power supply voltage VDD respectively, then, the bit line sense amplifier 210 latches the amplified voltage levels. Herein, a voltage level of the first bit line BL included in the first cell array 300a is maintained as the ground voltage by the first connection unit 250a.

Since the remaining operations for reading '0' is same to that for reading '1', detailed descriptions are omitted.

Hereinafter, the writing operation of the semiconductor memory device is described below.

The write operation is very similar to the read operation. While a data signal sensed and amplified by the bit line sense amplifier 210 is outputted to the first local data line LDB and LDBB during t3 at the read operation, a data signal inputted according to a write command is transferred to the write driver unit through the input/output pad and the data input/output buffer at the write operation. Then, the data signal outputted from the write driver unit is delivered to the bit line sense amplifier 210 through the first and the second local data lines.

Then, the bit line sense amplifier 210 replaces a previously latched data signal with the delivered data signal, and the newly latched data signal is stored to a unit cell at the restore step (t4). The bit line sense amplifier 210 also performs a sensing and amplifying operation by using the power supply voltage VDD and the low voltage VBB at the write operation.

Figure 12:
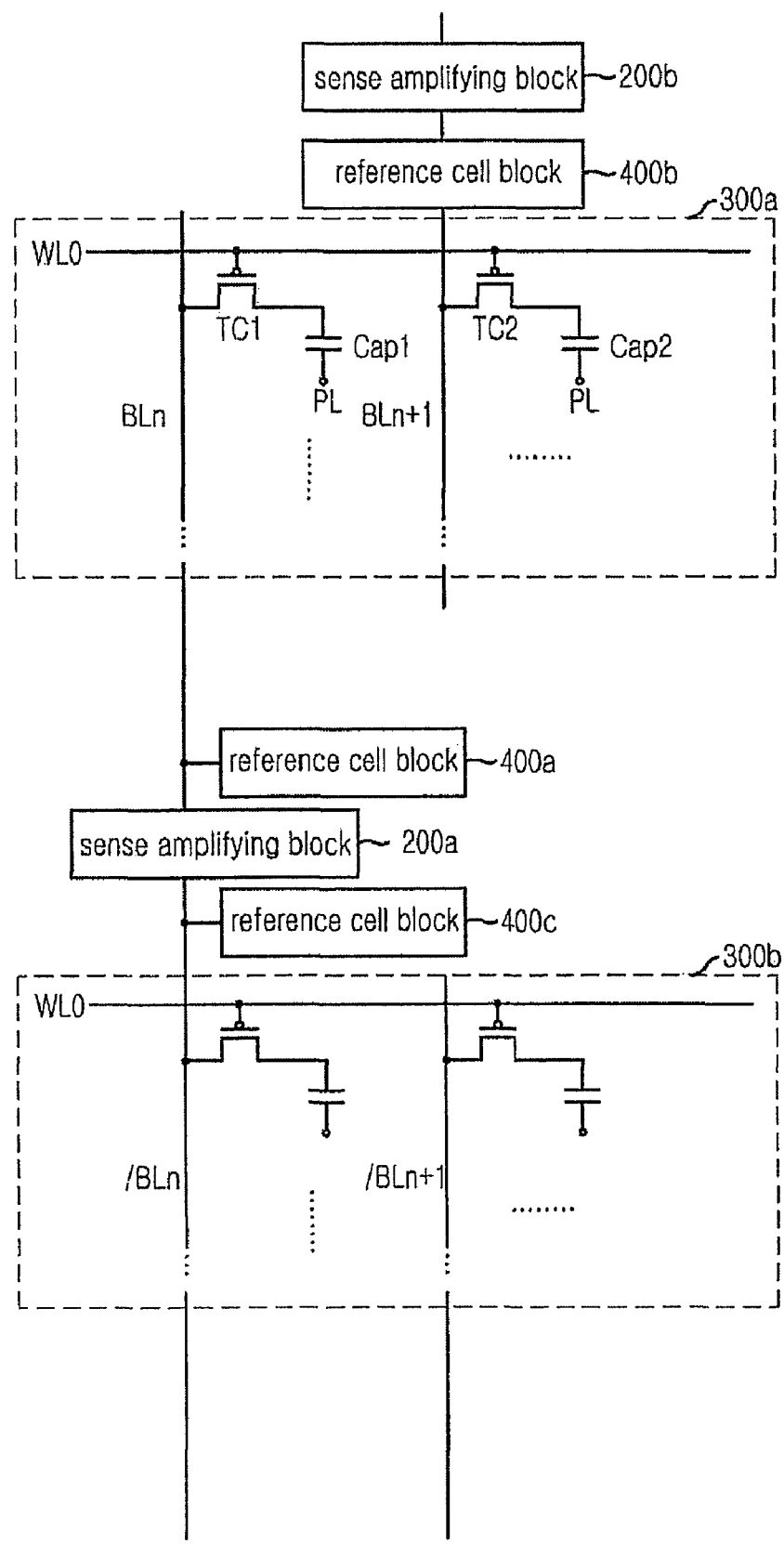
FIG. 12 is a block diagram describing a semiconductor memory device in accordance with an embodiment of the present invention.

FIG. 12 is a block diagram describing a semiconductor memory device in accordance with an embodiment of the present invention.

As shown, the semiconductor memory device employs an open bit line structure which a bit line pair is configured neighboring two cell arrays. Each cell array includes a plurality of transistors TC1 and TC2, respectively connected to capacitors Cap1 and Cap2. For example, a bit line BLn(BLn+1) is configured in a first cell array 300a and a bit line bar /BLn(/BLn+1) is configured in a second cell array 300b. When data is loaded at one of the bit line pair BLn, a reference signal is loaded at the other of the bit line pair /BLn by a reference cell block 400c. Then, a sense amplifier performs sensing and amplifying operation the difference between the bit line pair.

Figure 14:
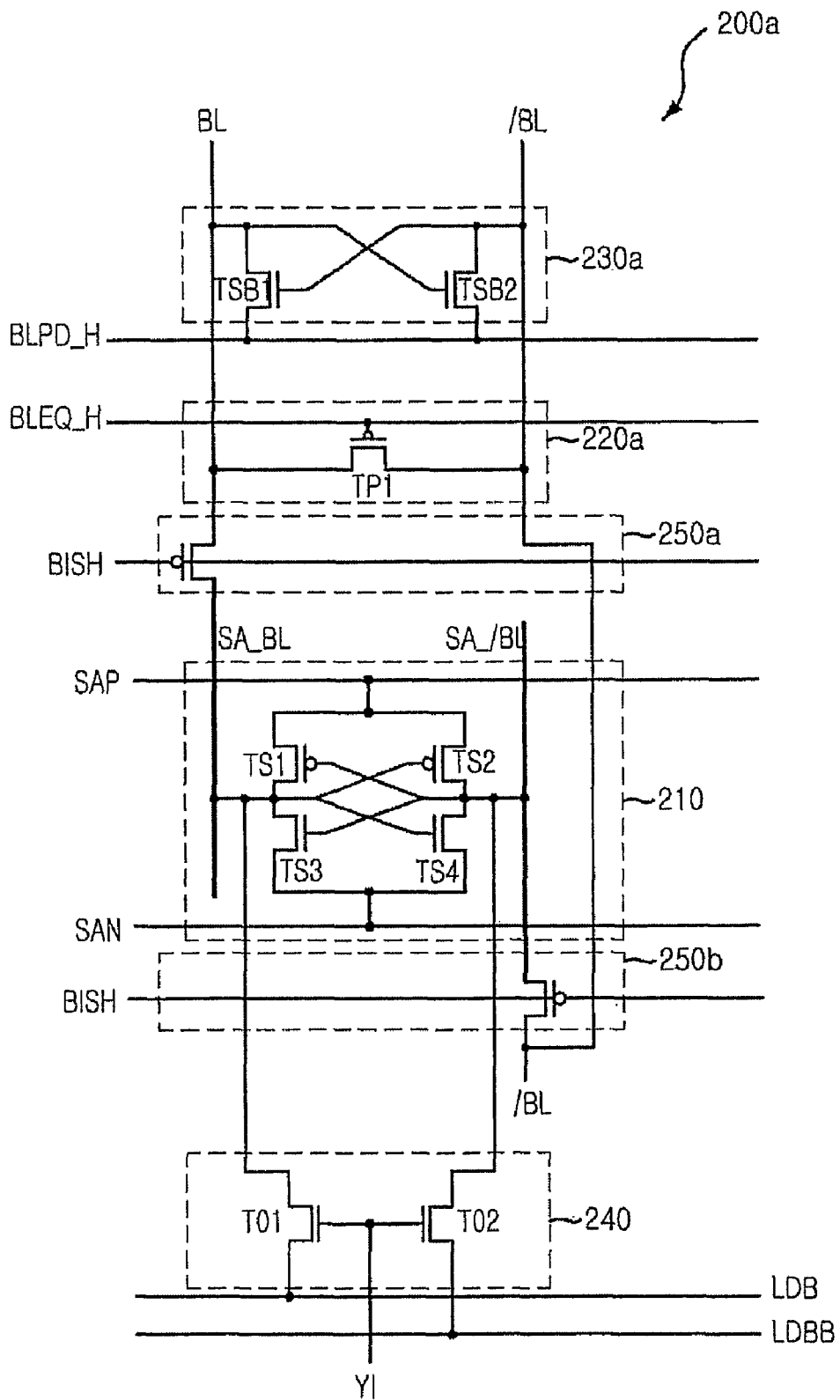
FIG. 14 is a schematic circuit diagram showing a sense amplifying block shown in FIG. 12.

FIGS. 13 and 14 are schematic circuit diagrams respectively depicting a reference cell block and a sense amplifying block shown in FIG. 12.

The operation of the semiconductor memory device employing the open bit line structure is substantially same with that of the semiconductor memory device employing the folded bit line structure. Therefore, detailed description about the operation of the semiconductor memory device shown in FIGS. 12 to 14 is omitted.

As above described, the semiconductor memory device in accordance with an embodiment of the present invention includes PMOS transistor in unit cells and in reference blocks and precharge blocks included in sense amplifying block. Therefore, the semiconductor memory device reduces an amount of leakage current occurring to the unit cell and it is possible to form the unit cell, the reference block, and the precharge block in a single N-well. Moreover, the semiconductor memory device efficiently operates with low voltage without any degradation of operation speed.

The present application contains subject matter related to Korean patent application No. 2005-08131, filed in the Korean Patent Office on Jan. 28, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
    a first cell array including a plurality of unit cells, each of which has a PMOS transistor and a capacitor, and a plurality of bit line pairs, wherein the first cell array provides a data signal stored in a unit cell selected from the unit cells to a first bit line pair selected from the bit line pairs, the first bit line pair containing a first bit line and a first bit line bar;
    a bit line sense amplifier for sensing and amplifying a voltage difference between the first bit line and the first bit line bar after the data signal is provided to the first bit line pair;
    a first reference cell block for transmitting a reference signal to the first bit line bar when the data signal is loaded on the first bit line and for transmitting the reference signal to the first bit line when the data signal is loaded on the first bit line bar; and
    a first precharge block for equalizing voltage levels of the first bit line and the first bit line bar during a precharge period without supplying a precharge voltage to the first bit line pair.

2. The semiconductor memory device as recited in claim 1, wherein the first precharge block includes a PMOS transistor for connecting the first bit line and the first bit line bar during the precharge period.

3. The semiconductor memory device as recited in claim 1, wherein the first reference cell block includes:
    a first reference capacitor whose one terminal is coupled to a reference power supply terminal for providing the reference signal;
    a first switch for connecting the other terminal of the first reference capacitor to the first bit line when the data signal is delivered to the first bit line bar; and a second switch for connecting the other terminal of the first reference capacitor to the first bit line bar when the data signal is delivered to the first bit line.

4. The semiconductor memory device as recited in claim 3, wherein a capacitance of the first reference capacitor is substantially the same as that of the capacitor of the unit cell in the first cell array.

5. The semiconductor memory device as recited in claim 3, wherein each of the first and the second switches includes a PMOS transistor.

6. The semiconductor memory device as recited in claim 4, wherein the reference power supply terminal provides one of a ground voltage, a half of a power supply voltage, and the power supply voltage.

7. The semiconductor memory device as recited in claim 3, wherein the number of the first reference capacitors included in the first reference cell block corresponds to the number of the bit line pairs included in the first cell array.

8. The semiconductor memory device as recited in claim 1, wherein the bit line sense amplifier performs sensing and amplifying operation based on a first low voltage which is lower than a ground voltage.

9. The semiconductor memory device as recited in claim 8, wherein the PMOS transistor in the unit cell is turned on in response to a second low voltage which is lower than the first low voltage.

10. The semiconductor memory device as recited in claim 8, wherein an absolute value of the first low voltage is greater than that of a threshold voltage of the PMOS transistor in the unit cell.

11. The semiconductor memory device as recited in claim 9, wherein the PMOS transistor in the unit cell is turned on in response to the second low voltage when the unit cell is activated and turned off in response to a power supply voltage when the unit cell is inactivated.

12. The semiconductor memory device as recited in claim 1, wherein the bit line sense amplifier amplifies the data signal based on a power supply voltage and a low voltage which is lower than a ground voltage.

13. The semiconductor memory device as recited in claim 12, wherein absolute values of the low voltage and the power supply voltage are the same.

14. The semiconductor memory device as recited in claim 1, further comprising a first connection block configured between the bit line sense amplifier and the first precharge block to connect/disconnect the first bit line pair to/from the bit line sense amplifier.

15. The semiconductor memory device as recited in claim 14, wherein the first connection block includes:
a first connecting PMOS transistor for connecting the first bit line and the bit line sense amplifier in response to a first connection control signal; and
a second connecting PMOS transistor for connecting the first bit line bar and the bit line sense amplifier in response to the first connection control signal.

16. The semiconductor memory device as recited in claim 15, wherein the first and the second connecting PMOS transistors are turned on by a first negative voltage during a period where the data signal is loaded on the first bit line or the first bit line bar and are turned on by a second negative voltage during the other periods, wherein an absolute value of the first negative voltage is greater than those of threshold voltages of the first and the second connecting PMOS transistors and an absolute value of the second negative voltage is substantially the same as those of the threshold voltages of the first and the second PMOS transistors.

17. The semiconductor memory device as recited in claim 15, further comprising a first auxiliary bit line sense amplifier for amplifying and maintaining a line voltage of the first bit line pair to a ground voltage, wherein the line voltage is a voltage of the first bit line or that of the first bit line bar whose voltage level is lower than the other.

18. The semiconductor memory device as recited in claim 17, wherein the first auxiliary bit line sense amplifier includes:
a first NMOS transistor whose first terminal receives a signal which is enabled when the bit line sense amplifier is activated, the other terminal is coupled to the first bit line connected between the first cell array and the first connection block, and gate is coupled to the first bit line bar connected between the first cell array and the first connection block; and
a second NMOS transistor whose first terminal receives the signal which is enabled when the bit line sense amplifier is activated, the other terminal is coupled to the first bit line bar connected between the first cell array and the first connection block, and gate is coupled to the first bit line connected between the first cell array and the first connection block.

19. The semiconductor memory device as recited in claim 17, further comprising:
a second cell array including a plurality of unit cells, each of which has a PMOS transistor and a capacitor, and a plurality of bit line pairs, wherein the second cell array provides a data signal stored in a unit cell selected from the unit cells to a second bit line pair selected from the bit line pairs, the second bit line pair containing a second bit line and a second bit line bar;
a second connection block for connecting/disconnecting the second line pair to/from the bit line sense amplifier;
a second reference cell block for transmitting a reference signal to the second bit line bar when the data signal is loaded on the second bit line and for transmitting the reference signal to the second bit line when the data signal is loaded on the second bit line bar; and
a second precharge block for equalizing voltage levels of the second bit line and the second bit line bar during the precharge period without supplying a precharge voltage to the second bit line pair.

20. The semiconductor memory device as recited in claim 19, wherein the second reference cell block and the second precharge block are activated when the second connection block is activated to thereby make the second bit line pair maintain the precharge voltage level.

21. The semiconductor memory device as recited in claim 19, wherein the second connection block includes:
a third connecting PMOS transistor for connecting the second bit line and the bit line sense amplifier in response to a second connection control signal; and
a fourth connecting PMOS transistor for connecting the second bit line bar and the bit line sense amplifier in response to the second connection control signal.

22. The semiconductor memory device as recited in claim 21, wherein the third and the fourth connecting PMOS transistors are turned on by a third negative voltage during a period where the data signal is loaded on the second bit line or the second bit line bar and are turned on by a fourth negative voltage during the other periods, wherein an absolute value of the third negative voltage is greater than those of threshold voltages of the third and the fourth connecting PMOS transistors and an absolute value of the fourth negative voltage is substantially the same as those of the threshold voltages of the third and the fourth PMOS transistors.

23. The semiconductor memory device as recited in claim 19, further comprising a second auxiliary bit line sense amplifier for amplifying and maintaining a line voltage of the second bit line pair to the ground voltage, where the line voltage is a voltage of the second bit line or that of the second bit line bar whose voltage level is lower than the other.

24. The semiconductor memory device as recited in claim 23, wherein the second auxiliary bit line sense amplifier includes:
a first NMOS transistor whose first terminal receives a signal which is enabled when the bit line sense amplifier is activated, the other terminal is coupled to the second bit line connected between the second cell array and the second connection block, and gate is coupled to the second bit line bar connected between the second cell array and the second connection block; and
a second NMOS transistor whose first terminal receives the signal which is enabled when the bit line sense amplifier is activated, the other terminal is coupled to the second bit line bar connected between the second cell array and the second connection block, and gate is coupled to the second bit line connected between the second cell array and the second connection block.

25. The semiconductor memory device as recited in claim 19, wherein the second precharge block includes a PMOS transistor for connecting the second bit line and the second bit line bar during the precharge period.

26. The semiconductor memory device as recited in claim 19, wherein the bit line sense amplifier includes:
a first sense amplifying PMOS transistor whose gate is connected to the first bit line bar by the first connection unit and to the second bit line bar by the second connection unit, wherein one terminal of the first sense amplifying PMOS transistor is coupled to a power supply voltage and the other terminal is coupled to the first bit line by the first connection unit and to the second bit line by the second connection unit;
a second sense amplifying PMOS transistor whose gate is connected to the first bit line by the first connection unit and to the second bit line by the second connection unit, wherein one terminal of the second sense amplifying PMOS transistor is coupled to the power supply voltage and the other terminal is connected to the first bit line bar by the first connection unit and to the second bit line bar by the second connection unit;
a first sense amplifying NMOS transistor whose gate is connected to the first bit line bar by the first connection unit and to the second bit line bar by the second connection unit, wherein one terminal of the first sense amplifying NMOS transistor is coupled to the first low voltage and the other terminal is connected to the first bit line by the first connection unit and to the second bit line by the second connection unit; and
a second sense amplifying NMOS transistor whose gate is connected to the first bit line by the first connection unit and to the second bit line by the second connection unit, wherein one terminal of the second sense amplifying NMOS transistor is coupled to the first low voltage and the other terminal is connected to the first bit line bar by the first connection unit and to the second bit line bar by the second connection unit.

27. The semiconductor memory device as recited in claim 26, further comprising a data input/output block for outputting a data signal sensed and amplified by the bit line sense amplifier to a data line and delivering a data signal inputted through the data line to the bit line sense amplifier.

28. The semiconductor memory device as recited in claim 27, wherein the data input/output block includes:
a first input/output MOS transistor whose gate receives an input/output control signal, first terminal is connected to the first and the second bit lines, and second terminal is coupled to a first data line; and
a second input/output MOS transistor whose gate receives the input/output control signal, first terminal is connected to the first and the second bit line bars, and second terminal is coupled to a second data line.

29. The semiconductor memory device as recited in claim 1, wherein the PMOS transistor in the unit cell is a finFET.

30. A semiconductor memory device, comprising:
a first cell array including a plurality of unit cells each of which has a PMOS transistor and a capacitor and transmitting a first data signal stored in a unit cell selected from the plurality of unit cells to a first bit line;
a second cell array including a plurality of unit cells each of which has a PMOS transistor and a capacitor and transmitting a second data signal stored in a unit cell selected from the plurality of the unit cells to a second bit line;
a bit line sense amplifier for sensing and amplifying a voltage difference between the first bit line and the second bit line;
a reference cell block for transmitting a reference signal to the second bit line when the first data signal is loaded on the first bit line and transmitting the reference signal to the first bit line when the second data signal is loaded on the second bit line; and
a precharge block for equalizing the first bit line and the second bit line without supplying the first and the second bit lines with a precharge voltage during a precharge period.

31. The semiconductor memory device as recited in claim 30, wherein the precharge block includes a PMOS transistor for electrically connecting the first and the second bit lines during the precharge period.

32. The semiconductor memory device as recited in claim 30, wherein the reference cell block includes:
a reference capacitor whose one terminal is coupled to a reference power supply terminal for providing the reference signal;
a first switch for connecting the other terminal of the reference capacitor to the first bit line when the second data signal is delivered to the second bit line; and
a second switch for connecting the other terminal of the reference capacitor to the reference power supply terminal during the precharge period.

33. The semiconductor memory device as recited in claim 32, wherein a capacitance of the reference capacitor is substantially the same as that of the capacitor in the unit cell.

34. The semiconductor memory device as recited in claim 33, wherein each of the first and the second switches is a PMOS transistor.

35. The semiconductor memory device as recited in claim 33, wherein the reference power supply terminal provides one of a ground voltage, half of a power supply voltage, and the power supply voltage.

36. The semiconductor memory device as recited in claim 32, wherein the number of the reference capacitors included in the first reference cell block corresponds to the number of the bit line pairs included in the first cell array.

37. The semiconductor memory device as recited in claim 30, wherein the bit line sense amplifier performs an amplifying operation based on a first low voltage which is lower than a ground voltage.

38. The semiconductor memory device as recited in claim 37, wherein the PMOS transistor included in the unit cell is turned on in response to a second low voltage which is lower than the first low voltage.

39. The semiconductor memory device as recited in claim 38, wherein an absolute value of the first low voltage is greater than that of a threshold voltage of the PMOS transistor.

40. The semiconductor memory device as recited in claim 39, wherein the PMOS transistor is turned on in response to the second low voltage when the unit cell is activated and turned off in response to a power supply voltage when the unit cell is inactivated.

41. The semiconductor memory device as recited in claim 30, wherein the bit line sense amplifier amplifies the first or the second data signal based on a power supply voltage and a low voltage which is lower than a ground voltage.

42. The semiconductor memory device as recited in claim 41, wherein absolute values of the low voltage and the power supply voltage are the same.

43. The semiconductor memory device as recited in claim 37, further comprising:
a first connection block configured between the bit line sense amplifier and the first cell array for preventing the first low voltage from being supplied to the first bit line; and
a second connection block configured between the bit line sense amplifier and the second cell array for preventing the first low voltage from being supplied to the second bit line.

44. The semiconductor memory device as recited in claim 43, wherein the first connection block includes a first connecting PMOS transistor for connecting the first bit line and the bit line sense amplifier.

45. The semiconductor memory device as recited in claim 44, wherein the second connection block includes a second connecting PMOS transistor for connecting the second bit line and the bit line sense amplifier.

46. The semiconductor memory device as recited in claim 45, wherein the first and the second connecting PMOS transistors are turned on by a first negative voltage during a period where a data signal is loaded on one of the first and the second bit line and are turned on by a second negative voltage during the other periods, wherein an absolute value of the first negative voltage is greater than those of a threshold voltages of the first and the second connecting PMOS transistors and an absolute value of the second negative voltage is substantially the same as those of the threshold voltages of the first and the second PMOS transistors.

47. The semiconductor memory device as recited in claim 45, further comprising a first auxiliary bit line sense amplifier for amplifying and maintaining the lower one of the first bit line between the first cell array and the first connection block and the second bit line between the second cell array and the second connection block as the ground voltage level.

48. The semiconductor memory device as recited in claim 47, wherein the first auxiliary bit line sense amplifier includes:
a first NMOS transistor whose first terminal receives the signal which is enabled when the bit line sense amplifier is activated, the other terminal is coupled to the first bit line connected between the first cell array and the first connection block, and gate is coupled to the second bit line connected between the second cell array and the second connection block; and
a second NMOS transistor whose first terminal receives the signal which is enabled when the bit line sense amplifier is activated, the other terminal is coupled to the second bit line connected between the second cell array and the second connection block, and gate is coupled to the first bit line connected between the first cell array and the first connection block.

49. The semiconductor memory device as recited in claim 30, wherein the bit line sense amplifier includes:
a first sense amplifying PMOS transistor whose gate is connected to the second bit line by the second connection block, wherein one terminal of the first sense amplifying PMOS transistor is coupled to the power supply voltage and the other terminal is coupled to the first bit line;
a second sense amplifying PMOS transistor whose gate is connected to the first bit line by the first connection unit, wherein one terminal of the second sense amplifying PMOS transistor is coupled to the power supply voltage and the other terminal is connected to the first bit line by the first connection block;
a first sense amplifying NMOS transistor whose gate is connected to the second bit line by the second connection block, wherein one terminal of the first sense amplifying NMOS transistor is coupled to the first low voltage and the other terminal is connected to the first bit line by the first connection block; and
a second sense amplifying NMOS transistor whose gate is connected to the first bit line by the first connection unit, wherein one terminal of the first sense amplifying NMOS transistor is coupled to the first low voltage and the other terminal is connected to the second bit line by the second connection block.

50. The semiconductor memory device as recited in claim 49, further comprising a data input/output block for outputting a data signal sensed and amplified by the bit line sense amplifier through a data line and for delivering a data signal inputted from the data line to the bit line sense amplifier.

51. The semiconductor memory device as recited in claim 50, wherein the data input/output block includes:
a first input/output MOS transistor whose gate receives an input/output control signal, first terminal is connected to a common node of the first sense amplifying PMOS transistor and the first sense amplifying NMOS transistor, and second terminal is coupled to a first data line; and
a second input/output MOS transistor whose gate receives the input/output control signal, first terminal is connected to the common node of the second sense amplifying PMOS transistor and the second sense amplifying NMOS transistor, and second terminal is coupled to a second data line.

52. The semiconductor memory device as recited in claim 30, wherein the PMOS transistor in the unit cell is a finFET.

* * * * *